(12) United States Patent
Scheuerlein et al.

(10) Patent No.: US 8,509,025 B2
(45) Date of Patent: Aug. 13, 2013

(54) MEMORY ARRAY CIRCUIT INCORPORATING MULTIPLE ARRAY BLOCK SELECTION AND RELATED METHOD

(75) Inventors: Roy E. Scheuerlein, Cupertino, CA (US); Luca G. Fasoli, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/215,134

(22) Filed: Aug. 22, 2011

(65) Prior Publication Data

US 2011/0299354 A1    Dec. 8, 2011

Related U.S. Application Data

(63) Continuation of application No. 12/396,461, filed on Mar. 2, 2009, now Pat. No. 8,004,927, which is a continuation of application No. 11/461,369, filed on Jul. 31, 2006, now Pat. No. 7,499,366.

(51) Int. Cl.
    *G11C 8/00*    (2006.01)
(52) U.S. Cl.
    USPC ............. 365/230.06; 365/230.03; 365/230.08
(58) Field of Classification Search
    USPC ........................... 365/230.06, 230.03, 230.08
    See application file for complete search history.

(56) References Cited

U.S. PATENT DOCUMENTS

| | | |
|---|---|---|
| 4,247,918 A | 1/1981 | Iwahashi et al. |
| 4,879,692 A | 11/1989 | Tokushige |
| 5,039,882 A | 8/1991 | Arakawa |
| 5,245,570 A | 9/1993 | Fazio et al. |
| 5,517,462 A | 5/1996 | Iwamoto et al. |
| 5,537,362 A | 7/1996 | Gill et al. |
| 5,587,959 A | 12/1996 | Tsukude |
| 5,627,792 A | 5/1997 | Tsujimoto |
| 5,673,224 A | 9/1997 | Chevallier et al. |
| 5,781,493 A | 7/1998 | Kobayashi |
| 5,818,764 A | 10/1998 | Yiu et al. |
| 5,831,924 A | 11/1998 | Nitta et al. |
| 5,881,017 A * | 3/1999 | Matsumoto et al. ..... 365/230.04 |
| 5,886,923 A | 3/1999 | Hung |
| 5,978,277 A | 11/1999 | Hsu et al. |
| 6,026,028 A | 2/2000 | Lin et al. |
| 6,034,882 A | 3/2000 | Johnson et al. |
| 6,034,913 A | 3/2000 | Freimuth |
| 6,049,486 A | 4/2000 | Lee et al. |
| 6,122,200 A | 9/2000 | Campardo et al. |
| 6,134,150 A | 10/2000 | Hsu et al. |
| 6,229,845 B1 | 5/2001 | Chan |
| 6,356,482 B1 | 3/2002 | Derhacobian et al. |

(Continued)

FOREIGN PATENT DOCUMENTS

EP    0401792 A2    12/1990

*Primary Examiner* — Son Dinh
*Assistant Examiner* — Nam Nguyen
(74) *Attorney, Agent, or Firm* — Dugan & Dugan PC

(57) ABSTRACT

Circuits and methods are described for decoding exemplary memory arrays of programmable and, in some embodiments, re-writable passive element memory cells, which are particularly useful for extremely dense three-dimensional memory arrays having more than one memory plane. In addition, circuits and methods are described for selecting one or more array blocks of such a memory array, for selecting one or more word lines and bit lines within selected array blocks, for conveying data information to and from selected memory cells within selected array blocks, and for conveying unselected bias conditions to unselected array blocks.

11 Claims, 21 Drawing Sheets

(56) References Cited

U.S. PATENT DOCUMENTS

| | | |
|---|---|---|
| 6,420,215 B1 | 7/2002 | Knall et al. |
| 6,438,041 B1 | 8/2002 | Yamada et al. |
| 6,477,088 B2 | 11/2002 | Ogura et al. |
| 6,490,218 B1 | 12/2002 | Vyvoda et al. |
| 6,525,953 B1 | 2/2003 | Johnson |
| 6,525,970 B2 | 2/2003 | Wang et al. |
| 6,570,786 B2 | 5/2003 | Lee |
| 6,614,693 B1 | 9/2003 | Lee et al. |
| 6,633,508 B2 * | 10/2003 | Muranaka et al. ....... 365/230.03 |
| 6,735,104 B2 | 5/2004 | Scheuerlein |
| 6,757,784 B2 | 6/2004 | Lu et al. |
| 6,765,813 B2 | 7/2004 | Scheuerlein et al. |
| 6,778,437 B1 | 8/2004 | Achter et al. |
| 6,804,148 B2 | 10/2004 | Bedarida et al. |
| 6,807,103 B2 | 10/2004 | Cavaleri et al. |
| 6,856,572 B2 | 2/2005 | Scheuerlein et al. |
| 6,859,410 B2 | 2/2005 | Scheuerlein et al. |
| 6,862,223 B1 | 3/2005 | Lee et al. |
| 6,868,034 B2 | 3/2005 | La et al. |
| 6,879,505 B2 | 4/2005 | Scheuerlein |
| 6,952,030 B2 | 10/2005 | Herner et al. |
| 6,952,043 B2 | 10/2005 | Vyvoda et al. |
| 7,046,577 B2 | 5/2006 | Leconte et al. |
| 7,054,219 B1 | 5/2006 | Petti et al. |
| 7,079,417 B2 | 7/2006 | Nam et al. |
| 7,106,652 B2 | 9/2006 | Scheuerlein |
| 7,142,471 B2 | 11/2006 | Fasoli et al. |
| 7,152,138 B2 | 12/2006 | Spencer et al. |
| 7,177,193 B2 | 2/2007 | Forbes |
| 7,233,024 B2 | 6/2007 | Scheuerlein et al. |
| 7,272,052 B2 | 9/2007 | Scheuerlein et al. |
| 7,283,403 B2 | 10/2007 | Johnson |
| 7,283,420 B2 | 10/2007 | Kim |
| 7,286,439 B2 | 10/2007 | Fasoli et al. |
| 7,298,665 B2 | 11/2007 | So et al. |
| 7,554,832 B2 | 6/2009 | Fasoli et al. |
| 2002/0048192 A1 | 4/2002 | Wang et al. |
| 2002/0196669 A1 | 12/2002 | Hsu et al. |
| 2003/0002340 A1 | 1/2003 | Lee |
| 2003/0230733 A1 | 12/2003 | Tanaka |
| 2005/0052915 A1 | 3/2005 | Herner et al. |
| 2005/0158950 A1 | 7/2005 | Scheuerlein et al. |
| 2006/0002187 A1 | 1/2006 | Forbes |
| 2006/0145193 A1 | 7/2006 | So et al. |
| 2006/0146639 A1 | 7/2006 | Fasoli et al. |
| 2006/0221752 A1 | 10/2006 | Fasoli et al. |
| 2006/0250836 A1 | 11/2006 | Herner et al. |
| 2006/0250837 A1 | 11/2006 | Herner et al. |
| 2006/0268626 A1 | 11/2006 | Hamzaoglu et al. |
| 2007/0069276 A1 | 3/2007 | Scheuerlein et al. |
| 2007/0070690 A1 | 3/2007 | Scheuerlein et al. |
| 2007/0072360 A1 | 3/2007 | Kumar et al. |
| 2007/0090425 A1 | 4/2007 | Kumar et al. |
| 2008/0023790 A1 | 1/2008 | Scheuerlein |
| 2008/0025061 A1 | 1/2008 | Scheuerlein et al. |
| 2008/0025062 A1 | 1/2008 | Scheuerlein et al. |
| 2008/0025066 A1 | 1/2008 | Fasoli et al. |
| 2008/0025067 A1 | 1/2008 | Scheuerlein et al. |
| 2008/0025068 A1 | 1/2008 | Scheuerlein et al. |
| 2008/0025069 A1 | 1/2008 | Scheuerlein et al. |
| 2008/0025076 A1 | 1/2008 | Scheuerlein |
| 2008/0025077 A1 | 1/2008 | Scheuerlein |
| 2008/0025078 A1 | 1/2008 | Scheuerlein et al. |
| 2008/0025085 A1 | 1/2008 | Scheuerlein et al. |
| 2008/0025088 A1 | 1/2008 | Scheuerlein et al. |
| 2008/0025089 A1 | 1/2008 | Scheuerlein et al. |
| 2008/0025093 A1 | 1/2008 | Scheuerlein et al. |
| 2008/0025094 A1 | 1/2008 | Scheuerlein et al. |
| 2008/0025118 A1 | 1/2008 | Scheuerlein |
| 2008/0025131 A1 | 1/2008 | Scheuerlein et al. |
| 2008/0025132 A1 | 1/2008 | Fasoli et al. |
| 2008/0025133 A1 | 1/2008 | Scheuerlein et al. |
| 2008/0025134 A1 | 1/2008 | Scheuerlein et al. |

* cited by examiner

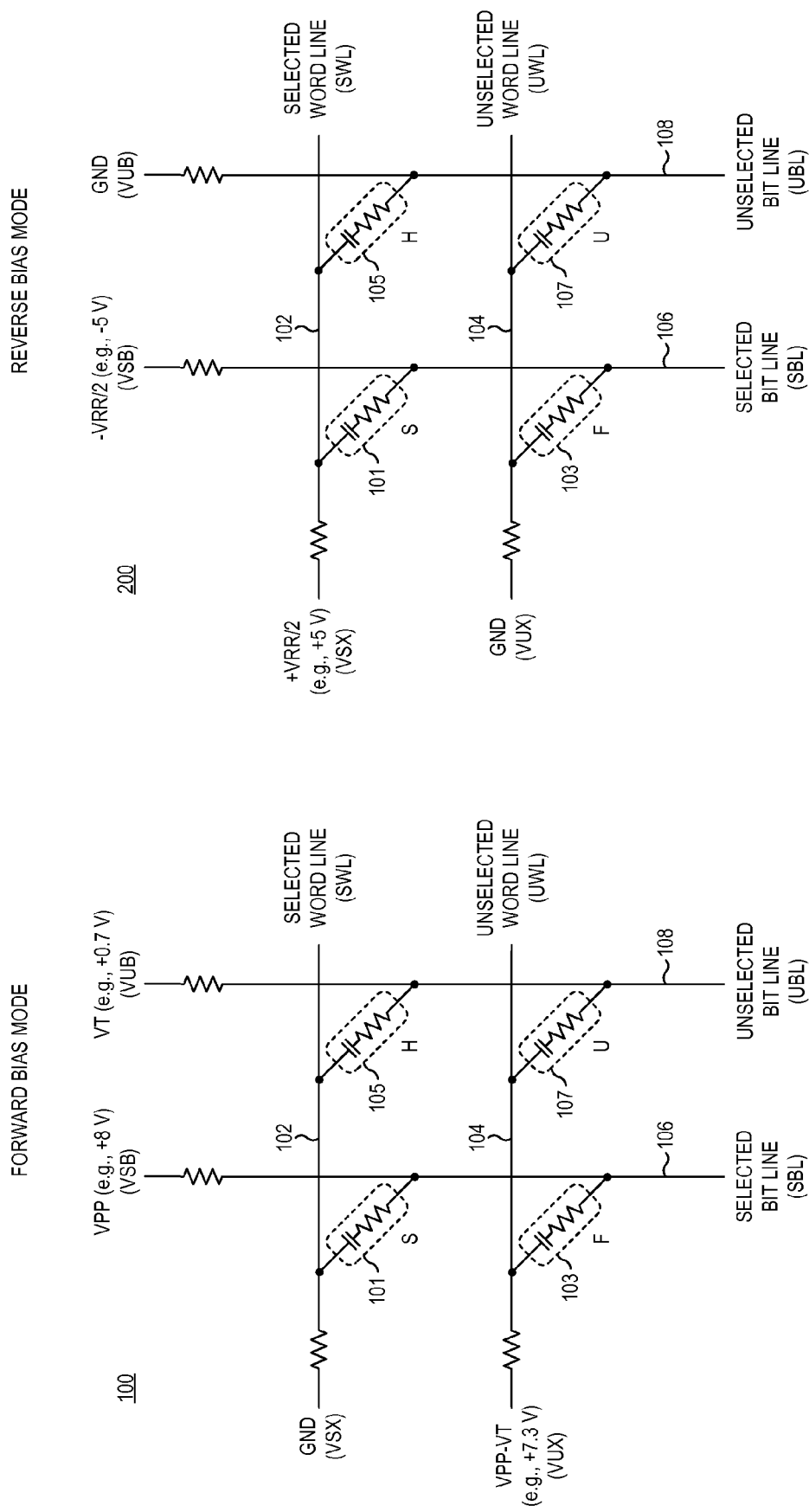

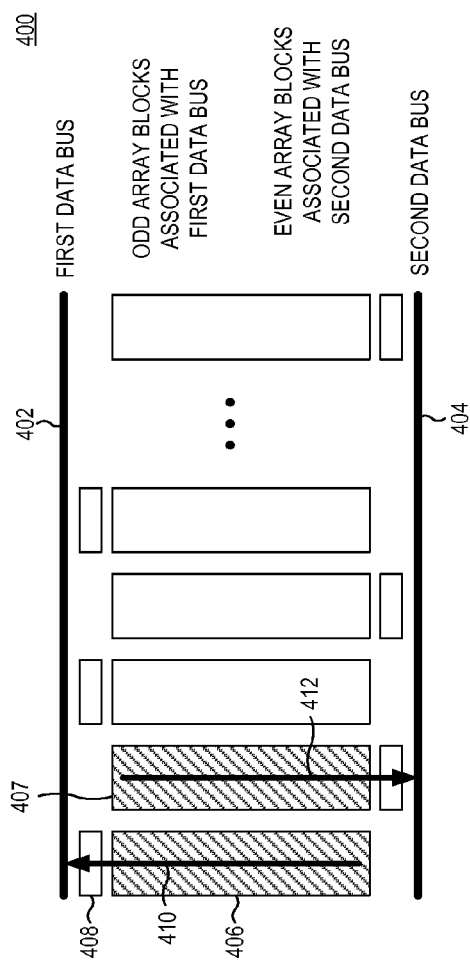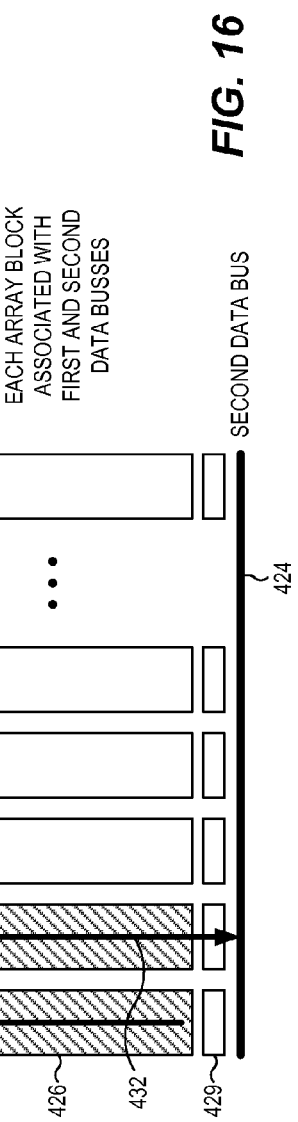

MEMORY ARRAY CIRCUIT INCORPORATING MULTIPLE ARRAY BLOCK SELECTION AND RELATED METHOD

CROSS-REFERENCE TO RELATED APPLICATION(S)

This application is a continuation application of U.S. patent application Ser. No. 12/396,461 filed on Mar. 2, 2009 and entitled "Reversible-Polarity Decoder Circuit and Method" by Roy E. Scheuerlein and Luca G. Fasoli, which application is a continuation of U.S. patent application Ser. No. 11/461,369 filed on Jul. 31, 2006 (now U.S. Pat. No. 7,499,366) and entitled "Method for Using Dual Data-Dependent Busses for Coupling Read/Write Circuits to a Memory Array" by Roy E. Scheuerlein and Luca G. Fasoli, which applications are hereby incorporated by reference in their entirety.

BACKGROUND

1. Field of the Invention

The present invention relates to programmable memory arrays, and particularly semiconductor integrated circuit memory arrays incorporating passive element memory cells, and even more particularly a three-dimensional memory array incorporating such memory cells.

2. Description of the Related Art

Certain passive element memory cells exhibit re-writable characteristics. For example, in certain memory cells programming may be achieved by forwarding biasing the memory cell (e.g., with reference to the polarity of a diode therewithin) with a voltage of approximately 6-8V, while erase may be achieved by reverse biasing the memory cell with a voltage of approximately 10-14V. These high voltages require use of special high voltage CMOS transistors within the word line and bit line decoders. These high-voltage transistors do not scale well as the memory cell word line and bit line pitch decreases. This is particularly problematic for 3D memory technology, in which the sheer density of word lines and bit lines exiting the array, and which must be interfaced with a word line and bit line driver, makes even more important the ability to provide decoder circuits, and particularly the word line and bit line driver circuits, compatible with ever smaller array line pitches, yet capable of impressing a sufficiently high voltage across a selected memory cell.

SUMMARY

In general, the invention is directed to a reversible-polarity decoder circuit and associated methods. However, the invention is defined by the appended claims, and nothing in this section shall be taken as limiting those claims.

In one aspect, the invention provides an integrated circuit device. An exemplary device includes: a memory array comprising a plurality of linearly-arranged array blocks, each array block comprising a plurality of memory cells, each memory cell coupled to an associated bit line; a first M-bit data bus spanning the plurality of linearly-arranged array blocks; a second M-bit data bus spanning the plurality of linearly-arranged array blocks; and a bit line selection circuit. The bit line selection circuit is configured, in a first mode of operation, to couple each of a first plurality M of bit lines within a first selected array block to a respective bus line of the first M-bit data bus, and to couple each of a second plurality M of bit lines within a second selected array block to a respective bus line of the second M-bit data bus. The bit line selection circuit is also configured, in a second mode of operation, to couple each of a third plurality M of bit lines within a third selected array block to a respective bus line of the first M-bit data bus, and to couple each of a fourth plurality M of bit lines within the third selected array block to a respective bus line of the second M-bit data bus.

In some embodiments the first mode of operation is a write mode, the second mode of operation is a read mode, and the bit line selection circuit is configured to support simultaneously reading 2*M bits from a single array block in the read mode of operation, and simultaneously writing M bits into each of two adjacent array blocks in the write mode of operation.

In another aspect, the invention provides a method for use with an integrated circuit having a memory array including a plurality of linearly-arranged array blocks. An exemplary method includes simultaneously selecting in a first mode of operation a greater number of array blocks than in a second mode of operation. In certain embodiments the first mode of operation is a write mode, and the second mode of operation is a read mode. In some embodiments, the method includes, in the write mode, simultaneously selecting two adjacent array blocks and writing M bits into each of said selected two adjacent array blocks, and in the read mode, selecting one array block and reading 2*M bits from the selected array block.

The invention in several aspects is suitable for integrated circuits having a memory array, for methods for operating such integrated circuits and memory arrays, for methods of making memory products incorporating such arrays, and for computer readable media encodings of such integrated circuits, products, or memory arrays, all as described herein in greater detail and as set forth in the appended claims. The described techniques, structures, and methods may be used alone or in combination with one another.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 1 is a schematic diagram of a memory array, illustrating selected and unselected word lines and bit lines, and exemplary bias conditions in a forward bias mode of operation.

FIG. 2 is a schematic diagram of the memory array depicted in FIG. 1, but illustrating exemplary bias conditions in a reverse bias mode of operation.

FIG. 15 is a block diagram of a memory bay, illustrating another arrangement in which two array blocks are shown as being simultaneously selected, each coupling its respective bit lines to a respective one of two data busses associated with the memory bay.

FIG. 16 is a block diagram of a memory bay, illustrating another arrangement in which two array blocks are shown as being simultaneously selected, each coupling its respective bit lines to a respective one of two data busses associated with the memory bay.

The use of the same reference symbols in different drawings indicates similar or identical items.

DESCRIPTION OF THE PREFERRED EMBODIMENT(S)

Figure 3:
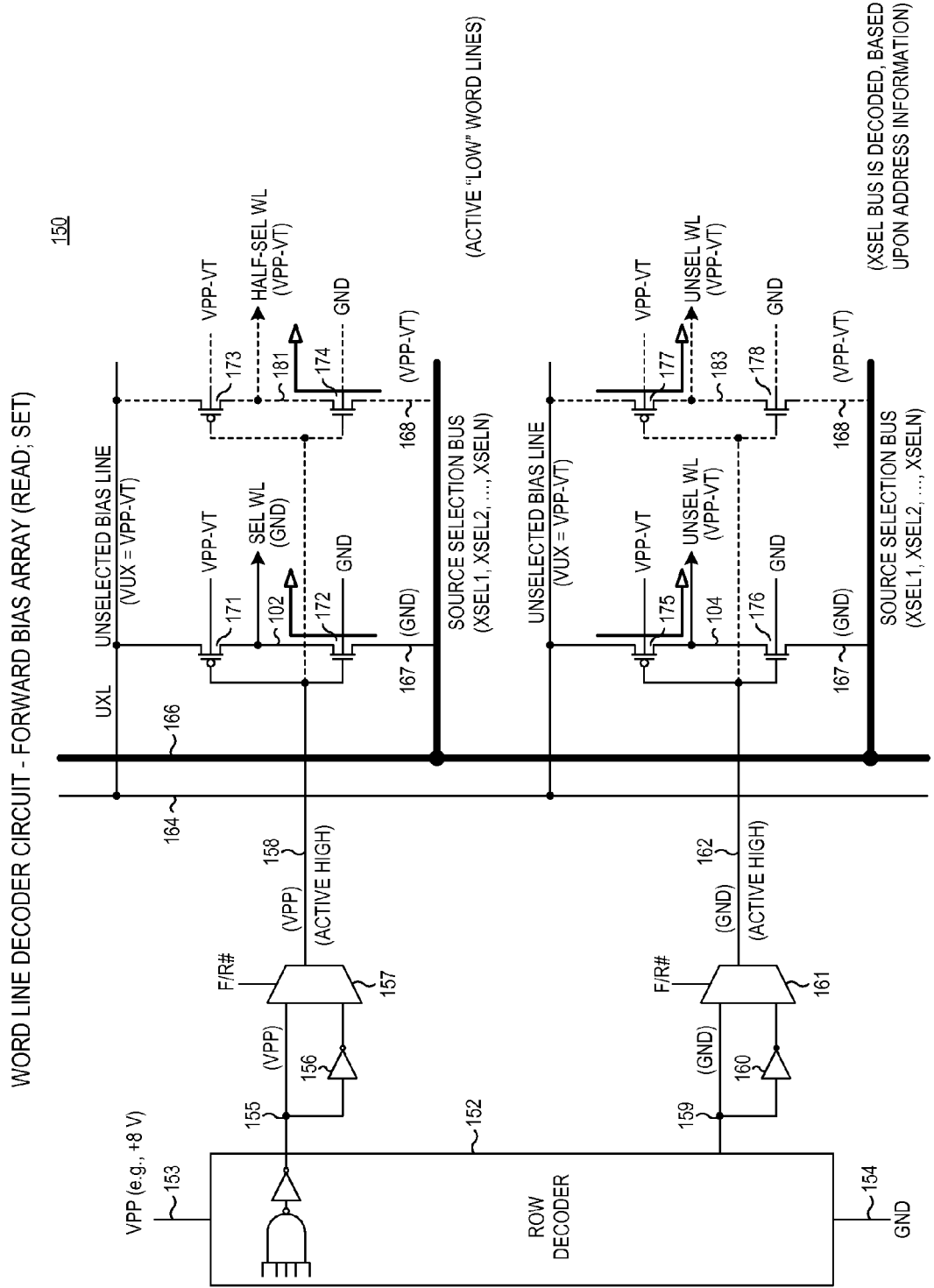
FIG. 3 is a schematic diagram of a word line decoder circuit, including exemplary conditions in a forward bias mode of operation.

FIG. 1 is a schematic diagram of an exemplary passive element memory array 100. Two word lines 102, 104 are shown, as well as two bit lines 106, 108. Word line 102 is assumed to be a selected word line (SWL), and word line 104 is assumed to be an unselected word line (UWL). Similarly, bit line 106 is assumed to be a selected bit line (SBL), and bit line 108 is assumed to be an unselected bit line (UBL). Four passive element memory cells 101, 103, 105, 107 are shown, each coupled between an associated word line and an associated bit line.

Memory cell 101 is associated with the selected word line 102 and the selected bit line 106, and may be viewed as an "S" cell (i.e., "selected" cell). Memory cell 103 is associated with the unselected word line 104 and the selected bit line 106, and may be viewed as an "F" cell (i.e., "off" cell). Memory cell 105 is associated with the selected word line 102 and the unselected bit line 108, and may be viewed as an "H" cell (i.e., "half-selected" cell). Lastly, memory cell 107 is associated with the unselected word line 104 and the unselected bit line 108, and may be viewed as a "U" cell (i.e., "unselected" cell).

Also illustrating in FIG. 1 are exemplary biasing conditions for a forward bias mode of operation. As described elsewhere herein, such a forward bias mode may be used for a programming mode, a block erase mode, and a read mode (although usually with different voltage levels or conditions for such different modes). As shown, the bias conditions may be viewed as appropriate for a programming mode of operation for a selected array block, and will be described as such.

The selected word line 102 is biased at a VSX voltage (e.g., ground), the selected bit line 106 biased at a VSB voltage (e.g., +8 volts), the unselected word line 104 is biased at a VUX voltage (e.g., +7.3 volts), and the unselected bit line 108 biased at a VUB voltage (e.g., +0.7 volts). The selected bit line bias voltage VSB may be viewed as the programming voltage VPP, as substantially this entire voltage is impressed across the selected memory cell 101 (since the selected word line is biased at ground), less certain resistive drops in the busses and array lines themselves. The unselected bit line bias voltage VUB is also preferably set at a value corresponding to an apparent "threshold voltage" in a forward biased direction of each memory cell, and is thus shown as a voltage VT being impressed on the unselected bit line 108. Similarly, the unselected word line bias voltage VUX is also preferably set at a value of VPP−VT.

Under these biasing conditions, the S cell 101 receives a forward bias voltage equal to VPP (e.g., +8 volts), the F cell 103 receives a forward bias voltage equal to VT (e.g., +0.7 volts), the H cell 105 receives a forward bias voltage equal to VT (e.g., +0.7 volts), and the U cell 107 receives a reverse bias voltage equal to VPP−2VT (e.g., −6.6 volts). There are several exemplary memory cell technologies that, when biased under these conditions, the selected cell will be changed to a lower value of resistance, while the F, H, and U cells will not appreciably change in resistance. Exemplary cells are described herebelow.

Referring now to FIG. 2, exemplary biasing conditions 200 are shown for a reverse bias mode of operation. As described elsewhere herein, such a reverse bias mode may be used for a programming mode or a block erase mode (although usually with different conditions for such different modes). As shown, the bias conditions may be viewed as appropriate for either a programming mode or erase mode of operation for a selected array block, and will be described as such.

Each of the bias conditions VSX, VUX, VSB, and VUB are now redefined for values appropriate for the present mode of operation. The selected word line 102 is biased at a VSX voltage of VRR/2 (e.g., +5 volts), and the selected bit line 106 biased at a VSB voltage of −VRR/2 (e.g., −5 volts). The unselected word line voltage VUX and the unselected bit line voltage VUB are both ground.

Under these biasing conditions, the S cell 101 receives a reverse bias voltage equal in magnitude to VRR (e.g., −10 volts), the F cell 103 receives a reverse bias voltage equal to VRR/2 (e.g., −5 volts), and the H cell 105 receives a reverse bias voltage equal to VRR/2 (e.g., −5 volts). Of note, the U cell 107 receives no bias across the cell.

There are several exemplary memory cell technologies (referenced below) that, when biased under these conditions, the selected cell will be changed from a lower value of resistance to a higher value of resistance, while the F, H, and U cells will not appreciably change in resistance. It should also be noted that the unselected U memory cells, which otherwise may support a considerable amount of leakage current when biased with several volts across such a cell, have no bias and therefore no leakage current. As will be described in further detail, many useful memory array embodiments include a far larger number of U cells than H cells of F cells, and such arrays will have significantly less leakage current in the unselected memory cells of the array, and hence much less power dissipation, than with other biasing schemes.

By "splitting" the VRR voltage in this reverse mode, and biasing the SBL at a negative voltage equal to one half of the programming voltage, and biasing the SWL at a positive voltage equal to one half of the programming voltage, the voltage requirements of both the bit line decoder and the word line decoder are significantly relaxed. Consequently, consistent with the small pitch of the array lines (e.g., word lines and bit lines), the high voltage transistors in the array line driver circuits take up less area because they may be designed for a relatively lower "split" voltage.

Other memory technologies have faced similar issues regarding the programming and erase voltages (and the area needed for such high-voltage transistors) not scaling at the same rate as the memory cell pitch. For example, the impact of this issue in FLASH memory is somewhat reduced because of the larger fanout of typical FLASH-based memory arrays. The more space consuming design rules for high voltage transistors can be ammortized in some newer technologies by increasing the memory block size. However, in a diode-based passive element memory array, larger block size comes at a cost of increased leakage through the unselected memory cells belonging to the selected array. By biasing such unselected memory cells as described in FIG. 2, this leakage component can be reduced to almost zero, and a larger block sizes achieved with little deleterious power dissipation.

Referring now to FIG. 3, an exemplary word line decoder circuit is shown, including showing bias conditions suitable for the forward bias mode of operation (as described in FIG. 1). A row decoder circuit is shown on the left side of the page, which shows two decoded outputs 158, 162. The decoded output 158 corresponds to a selected decoded output, while the decoded output 162 corresponds to an unselected decoded output. A row decoder 152, which may be implemented using any of a variety of well-known techniques, generates a plurality of decoded outputs, such as output 155, 159, which are conditionally inverted by the multiplexers 157, 161, and the inverters 156, 160. An inverting buffer is incorporated after the NAND gate to drive node 155 due to the large capacitive loading on node 158 (i.e., in the event, as here, that multiplexer 157 steers node 155 to the output 158). The row decoder 152 is operated in this mode of operation with an upper supply voltage equal to VPP coupled to power supply node 153, and a lower supply voltage of ground coupled to power supply node 154. In this mode of operation, the row decoder is an "active high" decoder, meaning that the selected output (or outputs), such as decoded output node 158, is driven to the higher of two available voltage states, which in this case is VPP. The unselected decoded outputs, such as decoded output node 162, are driven to the lower of the two available voltage states, which in this case is ground. The description that follows will initially assume that only one such decoded output node is selected (e.g., "high") at a time.

Each decoded output is coupled to one or more word line driver circuits. For example, decoded output node 158 is coupled to a word line driver circuit which includes PMOS transistor 171 and NMOS transistor 172. The respective drain terminal of transistors 171, 172 are both coupled to a word line, in this case representing the selected word line 102. While certain embodiments of this invention contemplate decoders other than multi-headed decoders, FIG. 3 depicts a second word line driver circuit also coupled to the decoded output node 158, which represents one or more remaining word line driver circuits associated with this particular decoded output node 158. This second word line driver circuit includes PMOS transistor 173 and NMOS transistor 174, the output of which drives a word line 181 which represents one or more half-selected word lines.

The respective source terminal of the NMOS transistor in each of these word line driver circuits is coupled to a respective bus line of a source selection bus XSEL. In this mode of operation, the source selection bus is decoded, based upon address information, so that one such a bus line is biased at an active state suitable for a word line for this mode of operation, while the remaining bus lines are biased at an inactive state suitable for word lines for this mode of operation. In certain embodiments, more than one such source selection bus line may be active, but we shall for now assume that the bus line 167 is active, and is biased at ground, while one or more remaining bus lines, represented by bus line 168, are inactive and are driven to the unselected word line voltage VUX (shown as VPP−VT).

Since the voltage on decoded output node 158 (VPP) is higher than the voltage of bus lines 167, 168, both of the NMOS transistors 172, 174 are turned on, thus driving the selected word line 102 to ground, and driving the half selected word line 181 to VPP−VT. These two conduction paths are indicated by the open arrowhead lines.

The respective source terminal of the PMOS transistor in each of these word line driver circuits is coupled to an unselected bias line UXL, also labeled node 164. In this mode of operation, the UXL bias line conveys the unselected word line voltage VUX. Since the voltage on decoded output node 158 (VPP) is higher than the voltage of the UXL bias line, both PMOS transistors 171, 173 are turned off.

The decoded output node 162 is coupled to a word line driver circuit which includes PMOS transistor 175 and NMOS transistor 176. The respective drain terminal of transistors 175, 176 are both coupled to a word line, in this case representing the unselected word line 104. A second word line driver circuit also coupled to the decoded output node 162 represents one or more remaining word line driver circuits associated with the decoded output node 162, and includes PMOS transistor 177 and NMOS transistor 178, the output of which drives an unselected word line 183.

As before, the respective source terminal of the NMOS transistor in each of these word line driver circuits is coupled to a respective bus line of a source selection bus XSEL. Since the voltage on decoded output node 162 (ground) is at or lower than the voltage of bus lines 167, 168, both of the NMOS transistors 176, 178 are turned off. The respective source terminal of the PMOS transistor in each of these word line driver circuits is coupled to the unselected bias line UXL node 164. Since the voltage on decoded output node 162 (ground) is lower than the voltage of the UXL bias line 164 (by more than the PMOS threshold voltage), both PMOS transistors 175, 177 are turned on, thus driving the unselected word lines 104, 183 to VUX (e.g., VPP−VT). These two conduction paths are indicated by the open arrowhead lines.

Figure 4:
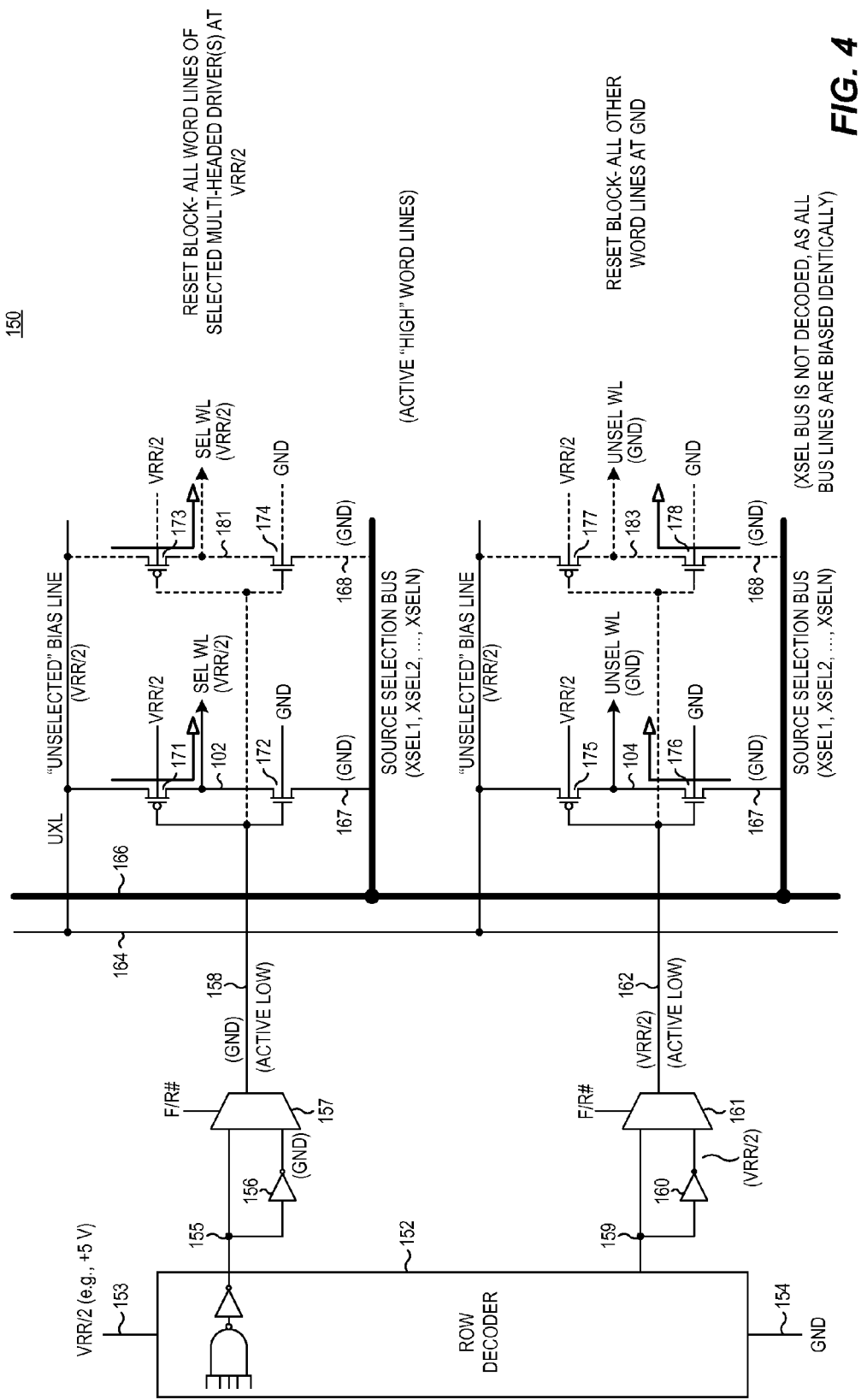
FIG. 4 is a schematic diagram of a word line decoder circuit, including exemplary conditions in a reverse bias mode of operation.

Referring now to FIG. 4, this same exemplary word line decoder circuit is shown including bias conditions suitable for the reverse bias mode of operation (as described in FIG. 2). The decoded output 158 of the row decoder circuit still corresponds to a selected decoded output, while the decoded output 162 corresponds to an unselected decoded output. The row decoder 152 is operated in this mode of operation with an upper supply voltage equal to VRR/2 coupled to power supply node 153, and a lower supply voltage of ground coupled to power supply node 154. In this mode of operation, the row decoder is an "active low" decoder, and the active (selected) decoded output 158 is driven to the lower of two available voltage states, which in this case is GND (ground), using inverter 156 and multiplexer 157. The unselected decoded outputs, such as decoded output node 162, are now driven to the higher of the two available voltage states, which in this case is VRR/2, using inverter 160 and multiplexer 161.

In this mode of operation, for the exemplary embodiment described, the individual bus lines of source selection bus XSEL are all driven to the same bias condition, being ground, and the "unselected" bias line UXL conveys a bias voltage equal to VRR/2 (e.g., +5 volts). In this reverse mode of operation, the bias line UXL actually conveys an active state suitable for word lines, rather than an inactive or unselected bias condition. Since the voltage on decoded output node 158 (GND) is considerably lower than the voltage of the bias line UXL (i.e., by more than a PMOS threshold voltage), both of the PMOS transistors 171, 173 are turned on, thus driving the selected word line 102 to VRR/2, and driving what would have been the half-selected word line (shown here as selected word line 181) also to VRR/2. These two conduction paths are indicated by the open arrowhead lines.

In this mode of operation the source selection bus XSEL is not decoded, and each such bus line is biased at an inactive state suitable for a word line (e.g., ground). Since the voltage on decoded output node 158 (ground) is no higher than the voltage of bus lines 167, 168, both of the NMOS transistors 172, 174 are turned off.

The decoded output node 162, which is an unselected output, is driven to VRR/2 by inverter 160 and multiplexer 161. Since the voltage on decoded output node 162 is higher than the voltage of bus lines 167, 168, both of the NMOS transistors 176, 178 are turned on, thus driving the unselected word lines 104, 183 to ground. These two conduction paths are indicated by the open arrowhead lines. Since the voltage on decoded output node 162 is the same as the voltage conveyed on the UXL bias line 164, both PMOS transistors 175, 177 are turned off.

Figure 5:
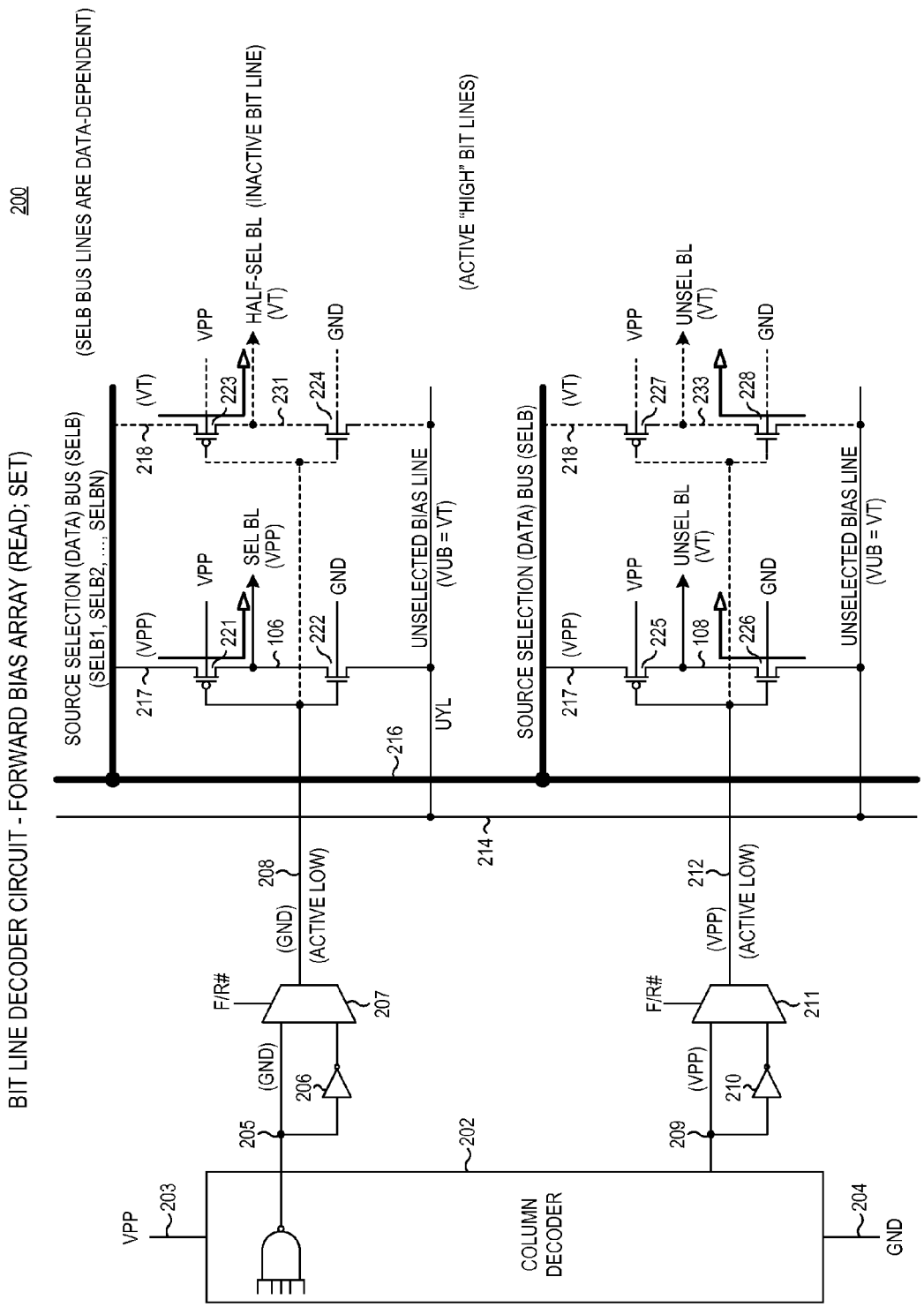
FIG. 5 is a schematic diagram of a bit line decoder circuit, including exemplary conditions in a forward bias mode of operation.

Referring now to FIG. 5, an exemplary bit line decoder circuit is shown, including showing bias conditions suitable for the forward bias mode of operation (as described in FIG. 1). A column decoder circuit is shown on the left side of the page, which shows two decoded outputs 208, 212. The decoded output 208 corresponds to a selected decoded output, while the decoded output 212 corresponds to an unselected decoded output. A column decoder 202, which may be implemented using any of a variety of well-known techniques, generates a plurality of decoded outputs, such as output 205, 209, which are conditionally inverted by the multiplexers 207, 211, and the inverters 206, 210. Unlike the row decoder, there is no inverting buffer after the NAND gate to drive node 205 because the capacitive loading on node 208 is much lower than for the row decoder outputs. The column decoder 202 is operated in this mode of operation with an upper supply voltage equal to VPP coupled to power supply node 203, and a lower supply voltage of ground coupled to power supply node 204. In this mode of operation, the column decoder is an "active low" decoder. The unselected decoded outputs, such as decoded output node 212, are driven to the higher of the two available voltage states, which in this case is VPP. The description that follows will initially assume that only one such decoded output node 208 is selected (e.g., "low") at a time.

Each of the decoded outputs is coupled to one or more bit line driver circuits. For example, decoded output node 208 is coupled to a bit line driver circuit which includes PMOS transistor 221 and NMOS transistor 222. The respective drain terminal of transistors 221, 222 are both coupled to a bit line, in this case representing the selected bit line 106. While certain embodiments of this invention contemplate decoders other than multi-headed decoders, FIG. 5 depicts a second bit line driver circuit also coupled to the decoded output node 208, which represents one or more remaining bit line driver circuits associated with this particular decoded output node 208. This second bit line driver circuit includes PMOS transistor 223 and NMOS transistor 224, the output of which drives a bit line 231 which represents one or more half-selected bit lines. In contrast to the word line decoder, such a half selected bit line may represent a selected bit line which is being maintained in an inactive state.

The respective source terminal of the PMOS transistor in each of these bit line driver circuits is coupled to a respective bus line of a source selection bus SELB. In this mode of operation, the source selection bus SELB is data dependent, and may further be decoded based upon address information, so that one or more such bus lines are biased at an active state suitable for a bit line for this mode of operation, while the remaining bus lines are biased at an inactive state suitable for bit lines for this mode of operation. In certain embodiments, more than one such source selection bus line may be active, but we shall for now assume that the bus line 217 is active, and is biased at VPP, while one or more remaining bus lines, represented by bus line 218, are inactive and are driven to the unselected bit line voltage VUB (shown as VT).

Since the voltage on decoded output node 208 (ground) is lower than the voltage of bus lines 217, 218, both of the PMOS transistors 221, 223 are turned on, thus driving the selected bit line 106 to VPP, and driving the half selected bit line 231 to VT. These two conduction paths are indicated by the open arrowhead lines.

The respective source terminal of the NMOS transistor in each of these bit line driver circuits is coupled to an unselected bias line UYL, also labeled node 214. In this mode of operation, the UYL bias line conveys the unselected bit line voltage VUB. Since the voltage on decoded output node 208 (ground) is lower than the voltage of the UYL bias line, both NMOS transistors 222, 224 are turned off.

The decoded output node 212 is coupled to a bit line driver circuit which includes PMOS transistor 225 and NMOS transistor 226. The respective drain terminal of transistors 225, 226 are both coupled to a bit line, in this case representing the unselected bit line 108. A second bit line driver circuit also coupled to the decoded output node 212 represents one or more remaining bit line driver circuits associated with the decoded output node 212, and includes PMOS transistor 227 and NMOS transistor 228, the output of which drives an unselected bit line 233.

As before, the respective source terminal of the PMOS transistor in each of these bit line driver circuits is coupled to a respective bus line of a source selection bus SELB. Since the voltage on decoded output node 212 (VPP) is at or higher than the voltage of bus lines 217, 218, both of the PMOS transistors 225, 227 are turned off. The respective source terminal of the NMOS transistor in each of these bit line driver circuits is coupled to the unselected bias line UYL node 214. Since the voltage on decoded output node 212 is VPP, both NMOS transistors 226, 228 are turned on, thus driving the unselected bit lines 108, 233 to VUB (e.g., VT). These two conduction paths are indicated by the open arrowhead lines.

Figure 6:
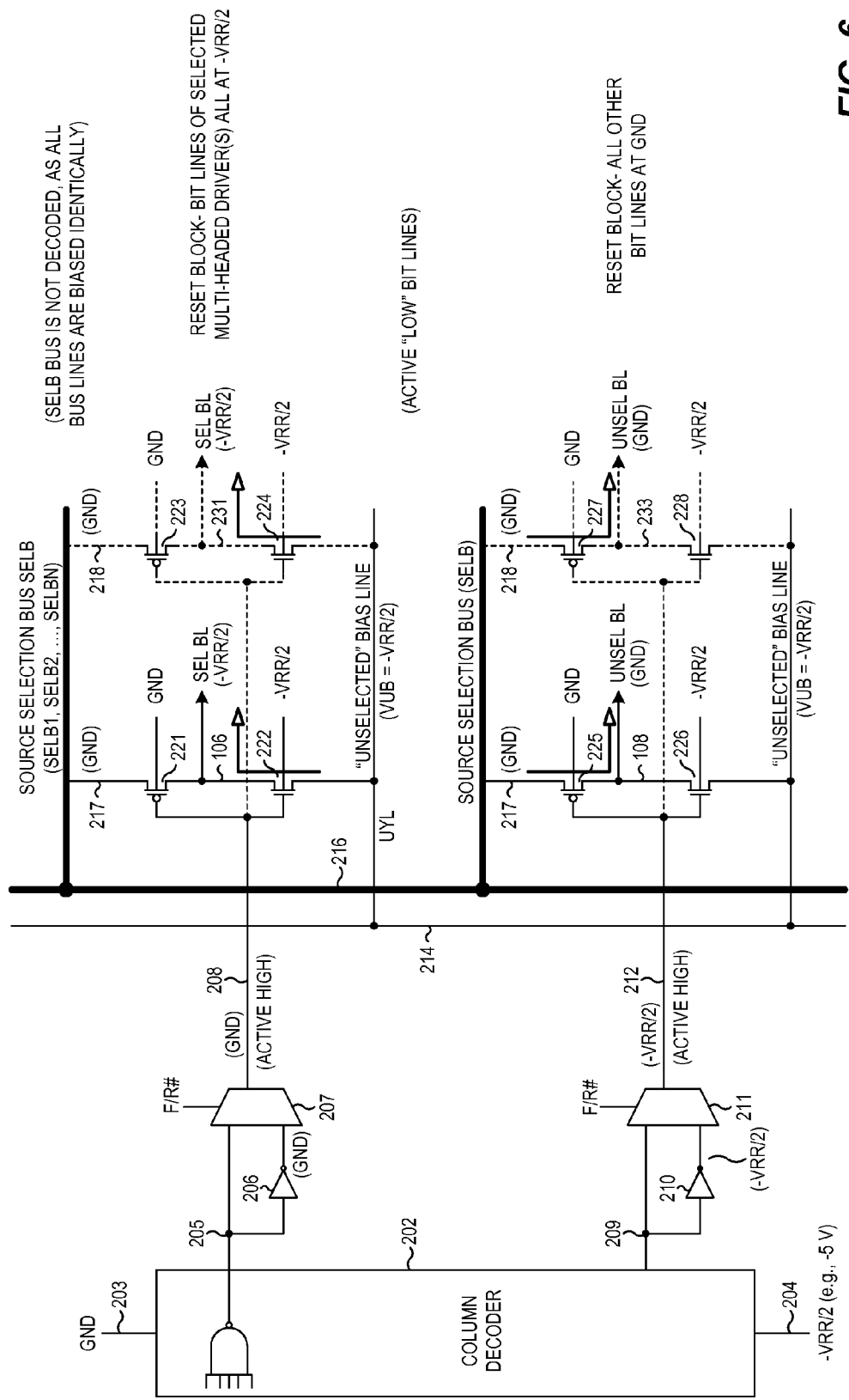
FIG. 6 is a schematic diagram of a bit line decoder circuit, including exemplary conditions in a reverse bias mode of operation.

Referring now to FIG. 6, the bit line decoder circuit is shown including bias conditions suitable for the reverse bias mode of operation (as described in FIG. 2). The decoded output 208 of the column decoder circuit still corresponds to a selected decoded output, while the decoded output 212 corresponds to an unselected decoded output. The column decoder 202 is operated in this mode with an upper supply voltage equal to GND coupled to power supply node 203, and a lower supply voltage of −VRR/2 coupled to power supply node 204. In this mode of operation, the column decoder is an "active high" decoder, and the active (selected) decoded output 208 is driven to the higher of two available voltage states, which in this case is GND (ground), by inverter 206 and multiplexer 207. The unselected decoded outputs, such as decoded output node 212, are now driven to the lower of the two available voltage states, which in this case is −VRR/2, by inverter 210 and multiplexer 211.

In this mode of operation, for the exemplary embodiment described, the individual bus lines of source selection bus SELB are all driven to the same bias condition, being ground, and the "unselected" bias line UYL conveys a bias voltage equal to −VRR/2 (e.g., −5 volts). In this reverse mode of operation, the bias line UYL actually conveys an active state suitable for bit lines, rather than an inactive or unselected bias condition. Since the voltage on decoded output node 208 (ground) is considerably higher than the voltage of the bias line UYL (i.e., by more than a NMOS threshold voltage), both of the NMOS transistors 222, 224 are turned on, thus driving the selected bit line 106 to −VRR/2, and driving what would have been the half-selected bit line (shown here as selected bit line 231) also to −VRR/2. These two conduction paths are indicated by the open arrowhead lines.

In this mode of operation the source selection bus SELB is not data-dependent nor decoded (at least within a given block), and each such bus line is biased at an inactive state suitable for a bit line (e.g., ground). Both of the PMOS transistors 221, 223 are turned off.

The decoded output node 212 is an unselected output and is driven to −VRR/2. Both of the PMOS transistors 225, 227 are turned on, thus driving the unselected bit lines 108, 233 to ground. These two conduction paths are indicated by the open arrowhead lines. Both NMOS transistors 226, 228 are turned off.

It should be noted that, in the forward mode, the column decoder is active low and the bit lines are active high. But in the reverse mode, the column decoder reverses its polarity and becomes active high, while the bit lines themselves also reverse polarity and become active low. Conversely, in the forward mode, the row decoder is active high and the word lines are active low. But in the reverse mode, the row decoder reverses its polarity and becomes active low, while the word lines themselves also reverse polarity and become active high. It should also be noted that the column decoder output levels shift in average voltage between the forward mode (i.e., GND to VPP) and reverse mode (i.e., −VRR/2 to GND).

When viewed as a non-multi-headed decoder (in FIGS. 3, 4, 5, and 6, only the non-dashed array line driver circuits), the operation of the decoder circuit may be described very simply. In the reverse mode, the word line decoder reverses its polarity and brings one selected word line high (~5V) and keeps all others at ground. The converse happens on the bit line selection side, where one bit line is selected and brought to −5V and all others are grounded. The end result is 10V of reverse bias across the selected memory cell and zero across the others. The transistors in the word line and bit line driver circuits only have to withstand 5V, or half the maximum voltage, rather than the entire voltage.

When one considers the implications of using multi-headed decoders (in FIGS. 3, 4, 5, and 6, including the dashed array line driver circuits), it should be noted that the circuits thus far described utilize a decoded source selection bus in the forward direction, which allows a single one of the group of array lines to be selected (while the remaining half-selected array lines are nonetheless driven to an unselected bias condition. However, in the reverse mode, the selected decoded output from the row and column decoder couples each array line to a single unselected bias line, such as UXL and UYL. Achieving half-selected array lines in the reverse mode is not possible with a single bias line. As a result, the above circuits and techniques are highly useful when arranged to select a block of array lines in the reverse mode, such as a "block erase". As can be seen in FIGS. 4 and 6, a block of selected word lines and a block of selected bit lines are simultaneously selected in the reverse mode, with no independently configurable half-selected array lines. Such a block operation avoids altogether any need for half-selected lines. The decoding implications can be very similar to that disclosed in U.S. Pat. No. 6,879,505 to Roy E. Scheuerlein, entitled "Word Line Arrangement Having Multi-Layer Word Line Segments for Three-Dimensional Memory Array", the disclosure of which is hereby incorporated by reference in its entirety. Whether such a block operation may be configured (or how large a block may be configured) largely rests upon the magnitude of the cell reset current, the number of cells conducting such reset current simultaneously, and whether the PMOS and NMOS transistors within the word line driver circuit and the bit line driver circuit can support such current with acceptable voltage drop.

Half-selected array lines may be provided in the reverse mode (in addition to that already provided in the forward mode) by using other techniques. In a first such technique, the row and column decoders may be powered by over-voltages, so that the decoded output nodes traverse higher than the PMOS source voltage and lower than the NMOS source voltage. By so doing, the selected word line may be driven up to the +VRR/2 voltage through the NMOS transistor, and the selected bit line may be driven down to the −VRR/2 voltage through the PMOS transistor. This utilizes the same transistors to drive the selected word line and bit line as during the forward mode.

Figure 7:
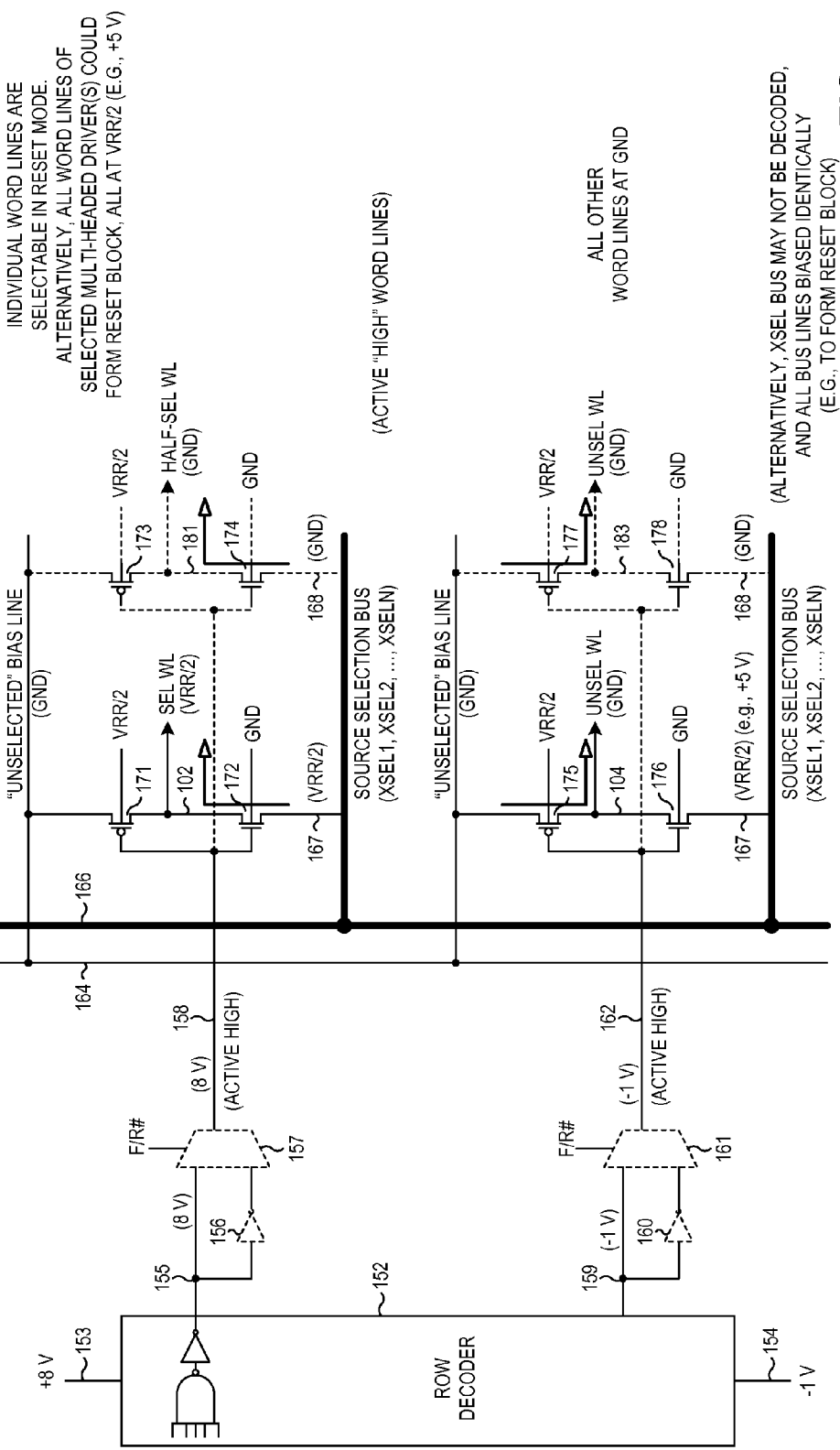
FIG. 7 is a schematic diagram of a word line decoder circuit, including exemplary conditions in a reverse bias mode of operation for certain other embodiments.
Figure 8:
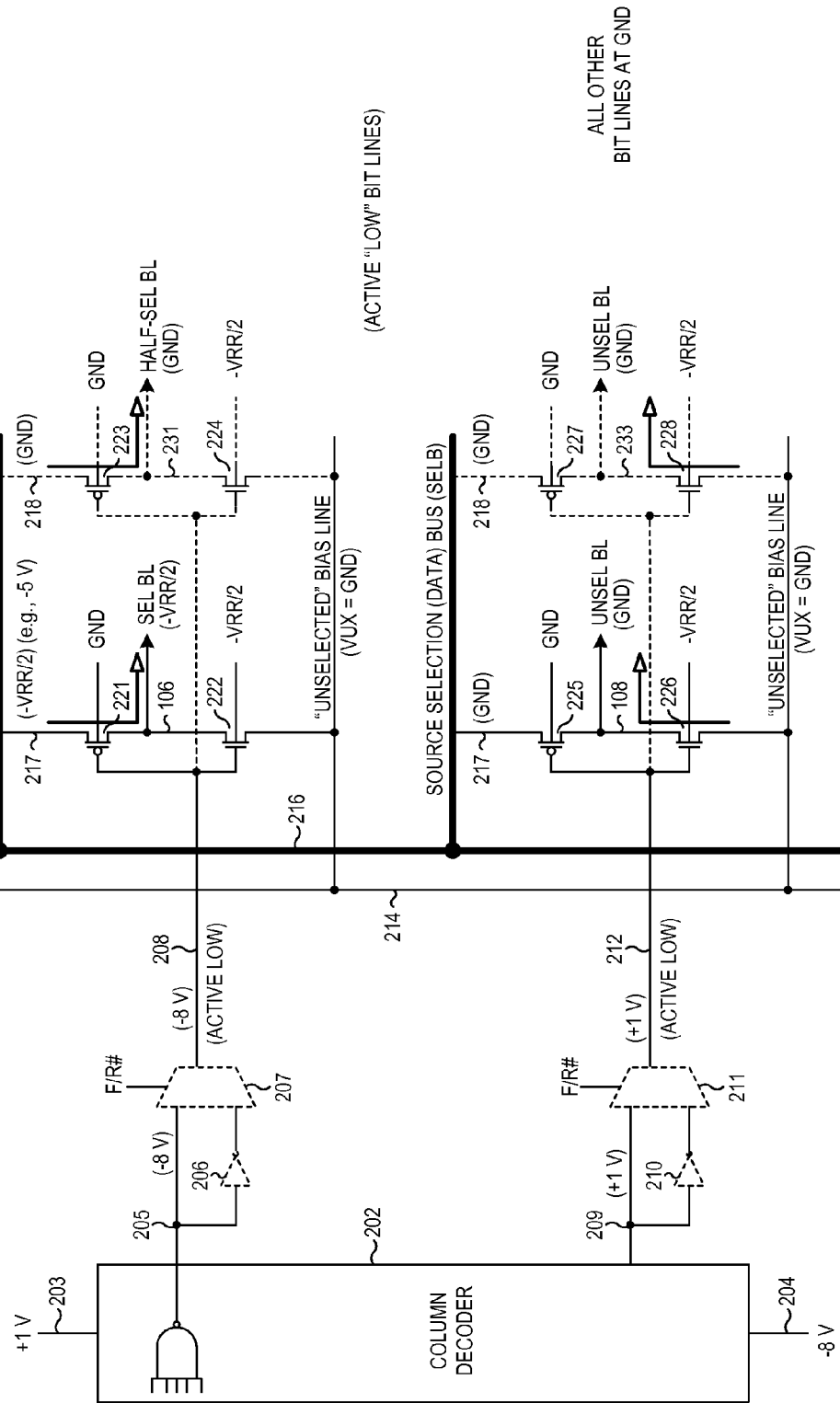
FIG. 8 is a schematic diagram of a bit line decoder circuit, including exemplary conditions in a reverse bias mode of operation for certain other embodiments.

Such a technique is illustrated in FIGS. 7 and 8. Referring initially to FIG. 7, a word line decoder circuit is illustrated which utilizes an overdriven decoded output to drive the array line drivers, whose sources remain at the bias conditions described above. In this row decoder circuit, the row decoder 152 is powered by an 8 volt upper supply voltage and a negative 1 volt lower supply voltage. The polarity of the decoded output nodes 158, 162 is reversed relative to that shown in FIG. 4, and is now an active high decoder providing a selected output 158 at +8 volts and an unselected decoded output node 162 at −1 volt. The source selection bus XSEL remains a decoded bus. One (or more) of its individual bus lines is selected and driven to +5 volts, while the unselected bus lines are driven to ground. The NMOS transistor 172 is turned on, and conducts the selected word line 102 to the associated XSEL bus line voltage (+5 volts). The NMOS transistor 174 is also turned on, and conducts the half-selected word line(s) 181 to ground. With the unselected decoded output node 162 at −1 volt, the PMOS transistors 175, 177 are both turned on, and conduct the unselected word lines 104, 183 to ground. In some embodiments utilizing this technique, the conditional output inverters 156, 160 and the multiplexers 157, 161 (shown here as "dashed") are not used.

Referring now to FIG. 8, a bit line decoder circuit is illustrated which also utilizes an overdriven decoded output to drive the array line drivers. In this column decoder circuit, the column decoder 202 is powered by a +1 volt upper supply voltage and a negative 8 volt lower supply voltage. The polarity of the decoded output nodes 208, 212 is reversed relative to that shown in FIG. 6, and is now an active low decoder providing a selected output 208 at −8 volts and an unselected decoded output node 212 at +1 volt. One (or more) of the individual SELB bus lines 217 is selected and driven to −5 volts, while the unselected SELB bus lines 218 are driven to ground. The PMOS transistor 221 is turned on, and conducts the selected bit line 106 to the associated SELB bus line voltage (−5 volts). The PMOS transistor 223 is also turned on, and conducts the half-selected bit line(s) 231 to ground. With the unselected decoded output node 212 at +1 volt, the NMOS transistors 226, 228 are both turned on, and conduct the unselected bit lines 108, 233 to ground. In some embodiments utilizing this technique, the conditional output inverters 206, 210 and the multiplexers 207, 211 are not used.

Figure 9:
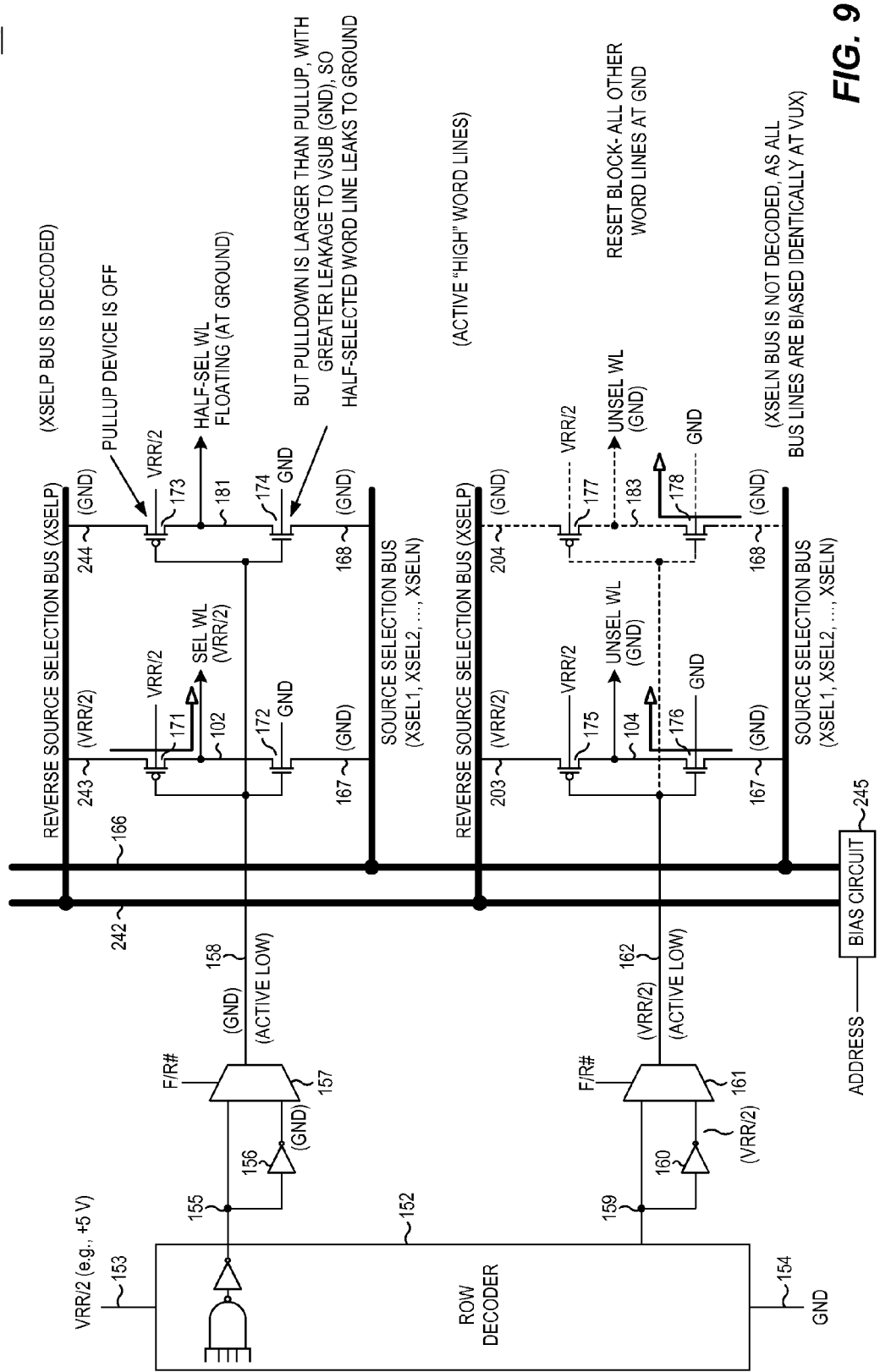
FIG. 9 is a schematic diagram of a word line decoder circuit having dual decoded source selection busses, including exemplary conditions in a reverse bias mode of operation useful for reset programming.

In another technique, half-selected word lines and bit lines may be provided in the reverse mode by incorporating a respective reverse source selection bus in place of the single unselected bias lines UXL and UYL. Referring now to FIG. 9, a word line decoder circuit is illustrated which utilizes dual decoded source selection busses. A reverse source selection bus XSELP for the PMOS transistors of the word line driver circuits has been incorporated in place of the unselected bias line UXL shown in FIG. 4. The remainder of this word line decoder circuit operates as before.

In the reverse mode, the selected decoded output node 158 is active low and driven to ground. A selected one of the individual bus lines of the reverse source selection bus XSELP is biased to an active bias condition suitable for the reverse mode of operation for a word line. In this case, the selected bus line 243 of the XSELP bus is driven to VRR/2, and the unselected bias lines 244 of the XSELP bus are driven to an inactive bias condition suitable for this mode of operation for word lines, in this case being driven to ground. The PMOS transistor 171 is turned on by the low voltage coupled to its gate, and drives the selected word line 102 to the VRR/2 potential. However the PMOS transistor 173 within the half-selected word line driver circuit remains off because the voltage on its gate is not low enough relative to its source, since both are at ground.

Since the NMOS transistor 174 is also turned off, neither transistor within the half-selected word line driver circuit is turned on. Consequently, the half selected word lines float at or near the ground potential. This occurs if, as is the case in this exemplary circuit, the NMOS pull-down transistor 174 is larger than the PMOS pull-up transistor 173. The larger transistor has a greater amount of leakage to its substrate well than does the smaller transistor. Consequently, since transistor 174 has a substrate tied to ground, the leakage current to ground dominates over the substrate leakage current to VRR/2 resulting from the PMOS transistor 173, and this net current tends to maintain the half-selected word lines 181 at or near the ground potential. The word line driver circuits associated with unselected decoded output nodes 162 operate as before, with the NMOS transistors 176, 178 being turned on to conduct the unselected word lines 104, 183 to ground.

In an alternative embodiment, the low level of the decoded output nodes 158, 162 may be driven below ground (e.g., to a voltage at or below the PMOS threshold voltage below ground, i.e., −VTP) by operating the row decoder 152, inverters 156, 160 and multiplexers 157, 161 using a lower power supply 154 equal to −VTP (or lower). As a result, the PMOS pull-up transistor 173 is turned on to actively drive the half-selected word line(s) 181 to ground.

Figure 10:
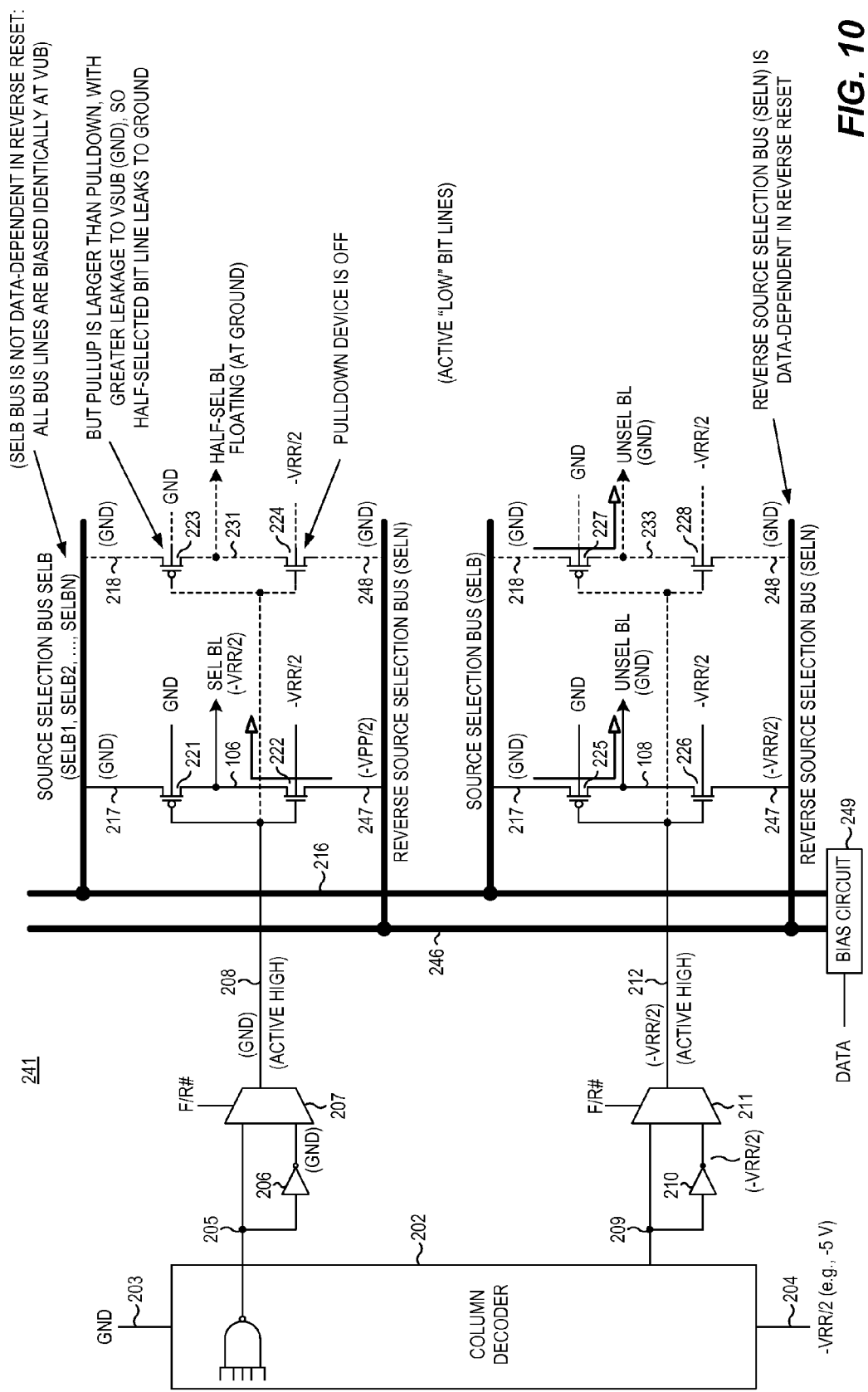
FIG. 10 is a schematic diagram of a bit line decoder circuit having dual data-dependent source selection busses, including exemplary conditions in a reverse bias mode of operation useful for reset programming.

An analogous situation occurs in a column decoder circuit incorporating dual data-dependent source selection busses. Referring now to FIG. 10, a bit line decoder circuit is illustrated which utilizes dual decoded (in this case, data-dependent) source selection busses. A reverse source selection bus SELN for the NMOS transistors of the bit line driver circuits has been incorporated in place of the unselected bias line UYL shown in FIG. 6. The remainder of this bit line decoder circuit operates as before.

In the reverse mode, the selected decoded output node 208 is active high and driven to ground. A selected one of the individual bus lines of the reverse source selection bus SELN is biased to an active bias condition suitable for the reverse mode of operation for a bit line. In this case, the selected bus line 247 of the SELN bus is driven to −VRR/2, and the unselected bias lines 248 of the SELN bus are driven to an inactive bias condition suitable for bit lines for this mode of operation, in this case being driven to ground. The NMOS transistor 222 is turned on by the high voltage coupled to its gate, and drives the selected bit line 106 to the −VRR/2 potential. However the NMOS transistor 224 within the half-selected bit line driver circuit remains off because the voltage on its gate is not high enough relative to its source, since both are at ground.

Since the PMOS transistor 223 is also turned off, neither transistor within the half-selected bit line driver circuit is turned on. Consequently, the half selected bit lines float at or near the ground potential. This occurs if, as is the case in this exemplary circuit, the PMOS pull-up transistor 223 is larger than the NMOS pull-down transistor 224. The larger transistor will have a greater amount of leakage to its substrate well than does the smaller transistor. Consequently since the larger transistor 223 has a substrate tied to ground, the leakage current to ground dominates over the substrate leakage current to −VRR/2 resulting from the NMOS transistor 224, and this net current tends to maintain the half-selected bit lines 231 at or near the ground potential. The bit line driver circuits associated with unselected decoded output nodes 212 operate as before, with the PMOS transistors 225, 227 being turned on to conduct the unselected bit lines 108, 233 to ground.

For both of the decoder circuits, operation in the forward mode proceeds substantially as indicated in FIGS. 4 and 6. Considering the row decoder case, in the forward mode the source selection bus is decoded, and all unselected word lines are driven to the unselected bias line UXL. In the forward mode using the dual decoded row decoder circuit, the reverse source selection bus is not decoded, and all its individual bus lines are driven to the same voltage as the UXL bus line. Thus, the word line driver circuits operate unchanged relative to FIG. 4. Rather, a single bias line UXL has been replaced by a plurality of "bias lines" which are each driven to the same voltage as the former UXL bias line, and to which each unselected word line is driven.

In the column decoder case, in the forward mode the source selection bus SELB is decoded, and all unselected bit lines are driven to the unselected bias line UYL. In the forward mode using the dual decoded column decoder circuit, the reverse source selection bus is not decoded, and all its individual bus lines are driven to the same voltage as the UYL bus line. Thus, the bit line driver circuits operate unchanged relative to FIG. 6. Rather, a single bias line UYL has been replaced by a plurality of "bias lines" which are each driven to the same voltage as the former UYL bias line, and to which each unselected bit line is driven.

The decoder circuits thus far described are useful for implementing memory arrays in which the memory cells include a reversible resistor plus a diode. Such memory cells may be reset using a reverse bias applied across the cell, and providing for half-selected word lines and bit lines allows individual word lines and bit lines to be placed in a reset bias condition, thus providing the capability to reset individual memory cells without having to reset an entire block.

The technique described in FIGS. 7 and 8 has the advantage of only a single decoded source selection bus, although since the row and column decoders are powered by over-voltages, the voltage requirement for such decoder circuits is higher. The technique described in FIGS. 9 and 10 reduces the voltage requirements by not utilizing over-voltage powering the two decoder circuits, at the expense of an additional decoded (and/or data dependent) reverse source selection bus, and the likely increased area to incorporate the array line drivers using two decoded source selection busses. The bit line select circuit has twice as many bus lines, and may be wiring limited. The word line select circuits may also be somewhat larger and wiring limited (i.e., the word line driver circuits include six additional decoded lines for a six-headed decoder, and the PMOS device is slightly larger than earlier circuits). Nonetheless, either technique may be useful over the other for particular embodiments.

The forward mode was described above in the context of a programming condition, in which the voltage applied to the selected bit line is VPP. The forward mode is also applicable for a read mode in which the selected bit line is driven to a read voltage VRD, and the selected word line again is driven to ground. Such a read voltage may be a much lower voltage than the programming voltage VPP, and the unselected word line bias voltage VUX and the unselected bit line bias voltage VUB accordingly reduced over their values for the programming mode.

Certain memory cells may be "programmed" using a forward bias mode, and block erased using the reverse mode. Other cells may be pre-conditioned (such as during manufacture) using an initial forward bias programming technique, but then are "programmed" using the reverse mode, and "erased" using the forward mode. To avoid confusion with historical usage in the programmable arts, and to comprehend different memory technologies that are contemplated for use with the decoder circuits thus far described, three different modes of operation are useful to describe: read, set, and reset. In the read mode, a read voltage VRD is applied across a selected memory cell. In the set mode, a set voltage VPP is applied across a selected memory cell. In the exemplary embodiments thus far described, the read voltage VRD and the set voltage VPP are both positive voltages, and such modes are carried out using the forward mode of decoder operation. In the reset mode, a reset voltage VRR is applied across a selected memory cell. In the exemplary embodiments thus far described, the reset voltage VRR is applied as a reverse bias voltage, and is carried out using the reverse mode of decoder operation.

The reset mode described above uses a split voltage technique to limit the voltage requirements for the decoder circuits, and drives a selected bit line to a negative voltage (i.e., using a triple well semiconductor structure). Alternatively, the reset mode may be carried out with entirely non-negative voltages. In such a case, the reset voltage VRR is conveyed to the selected word line, and ground conveyed to the selected bit line. The VUX and VUB voltages are preferably set to approximately VRR/2.

Many types of memory cells (described below) are capable of being programmed using the reset mode. In certain of these memory cell technologies, an antifuse within each memory cell is initially popped in the forward direction. Then the resistance of each memory cell is "tuned" in the reverse bias direction to accomplish programming. This would be the case for a one-time-programmable cell. For re-writable cells, the cell is erased using the forward direction, which could be performed in a block of various sizes, and then programmed using the reverse mode.

The reverse bias is used to reset the selected memory cell. The programming current is supplied by a diode breakdown. In addition, the bias conditions associated with such programming may be carefully controlled, including controlling the voltage ramp of the selected word line and/or bit line. Additional insight into useful programming techniques maybe found in U.S. Pat. No. 6,952,030 referenced below. Multiple programming operations may be used to program various resistance states, as described in the 023-0049 and 023-0055 applications, referenced below, and as described in more detail in the MA-163-1 application, referenced below. The use of sloped programming pulses is described in the SAND-01114US0 and SAND-01114US1 applications, referenced below, and techniques for trimming the resistance of multiple cells is described in the SAND-01117US0 and SAND-01117US1 applications, referenced below.

The use of the reset programming as described above, particularly in the context of the dual decoded source select lines, for programming a passive element memory cell incorporating a trimmable resistive element is particularly useful in providing great flexibility to allow for a larger array block size. Even in a selected array block (as all the descriptions above have assumed), there is no bias across the unselected memory cells in the reset mode, and therefore no wasted power dissipation. The reverse current through a cell (Irev) is not a concern for block size. Therefore many blocks may be selected to increase the write bandwidth. In addition, the voltage across each half selected memory cell is only one half of the programming voltage, and is safe for these cells.

It should be noted that in the descriptions above, the reset mode describes selected and half-selected word lines and bit lines. In the context of row selection, for example, such a half-selected word line may in fact be "not selected" by a given address, and such term is an artifact of the multi-headed word line driver structure. However, in the context of the bit lines, such a half-selected bit line may in fact be selected as far as the column address is concerned, but may be biased to an inactive state rather than the active state for the bit lines, either because the particular data for that bit line does not require "programming" the cell, or because the bit line is "waiting" to be programmed. This occurs when fewer than the number of bit line decoder heads are programmed at the same time. Of note, however, programming bandwidth concerns suggest configuring a memory array to simultaneously program as many bit lines as possible.

Triple well processing allows the selected bit line(s) to be taken to a negative voltage while the selected word line(s) is taken to a positive voltage. In the reset programming (i.e., reverse mode), the reference level for all unselected array lines (bit lines and word lines) is ground, which allows for rapid decoding and selection of both word lines and bit lines. Referring back to the description of the half-selected word lines and bit lines being floating at ground (due to the leakage current to the well potential of the larger of the two driver transistors), the resistive nature of the memory cells provides an additional leakage current between such half-selected array lines and the unselected array lines, which are actively held at the unselected bias level. This further encourages the unselected array lines to remain floating at or near the unselected bias potential.

Two-dimensional memory arrays are contemplated, but the decoder arrangements are believed particularly useful for a 3D memory array having multiple memory planes. In certain preferred embodiments, the memory array is configured with each word line comprising word line segments on each of more than one memory plane, as described below.

Figure 11:
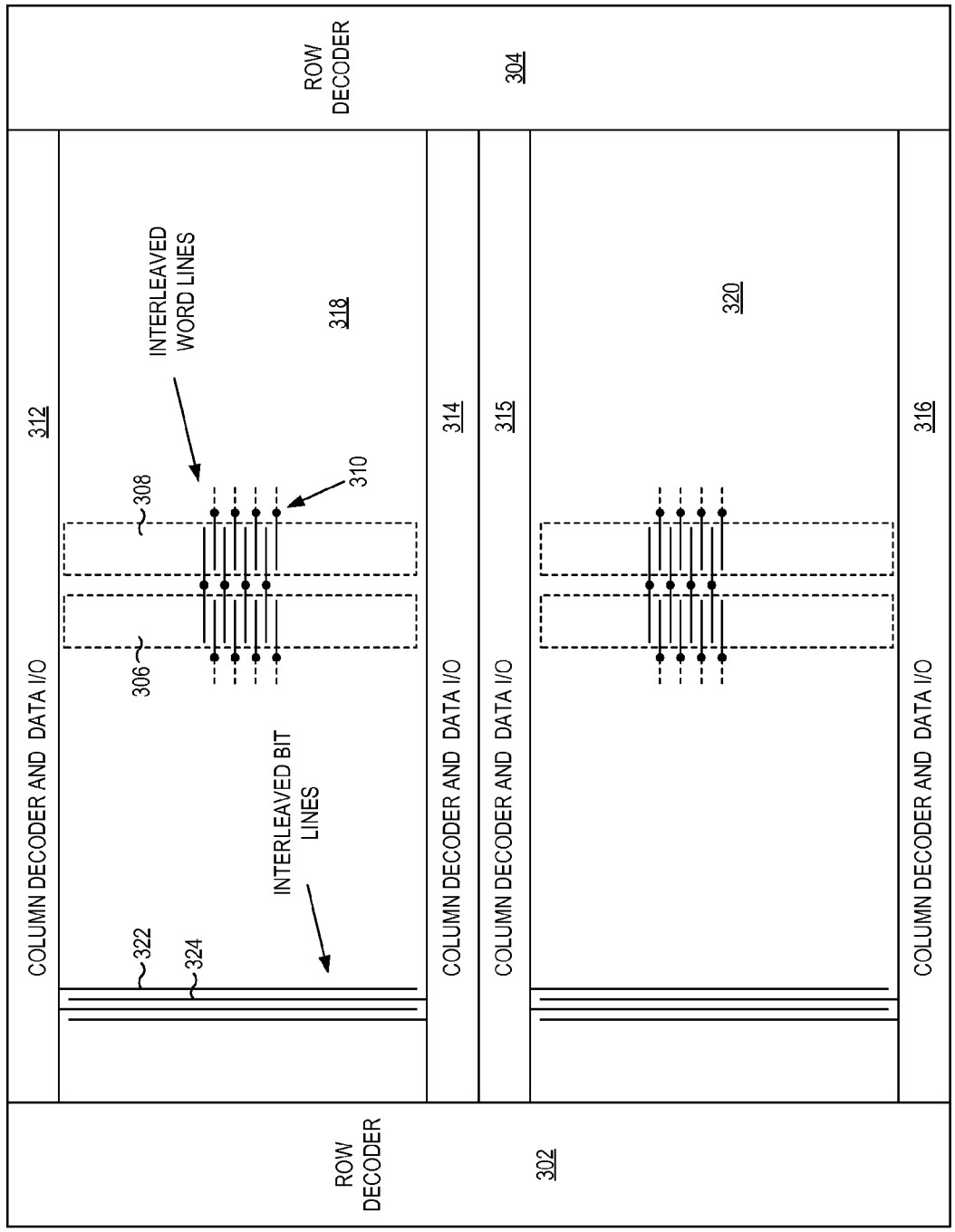
FIG. 11 is a block diagram depicting an exemplary integrated circuit including a three-dimensional memory array, and which integrated circuit includes a global row decoder on one side of the array, and a pair of column decoders on both top and bottom of the array.

FIG. 11 is a block diagram of an exemplary memory array 300. Dual row decoders 302, 304 generate row select lines for the array, which each traverse across the array 300, as will be described herein. In this embodiment, the word line driver circuits (not shown) are spatially distributed beneath the memory array and make connection to the word lines by way of vertical connections (one of which is labeled 310) on alternating sides of individual memory array blocks (two which are labeled 306, 308). The memory array shown includes two memory "stripes" 318, 320, and further includes four column decoder and bit line circuit blocks 312, 314, 315, 316 respectively at the top, upper middle, lower middle, and bottom of the array. As described herein, additional stripes may also be incorporated, and each stripe may include one or more memory bays. The bit lines within each block are also 2:1 interleaved to relax the pitch requirements of the column related circuitry. As an example, bit line 322 is associated with (i.e., driven and sensed by) the upper column circuit block 312, while bit line 324 is associated with the bottom column circuits block 314.

In exemplary embodiments, the memory array 300 is a three-dimensional memory array of passive element memory cells formed on each of four memory planes. Such memory cells preferably incorporate a trimmable resistor element, as described herein, and may also include an antifuse. Each logical word line is connected to a word line segment on each of four word line layers (each associated with a respective memory plane).

Each stripe of the memory array 300 is divided into a large number of blocks, such as block 308. In certain exemplary embodiments described herein, each memory bay includes 16 array blocks, but other numbers of blocks may be implemented. In the exemplary embodiment depicted, each block includes 288 bit lines on each of four bit line layers for the respective four memory planes, thus totaling 1,152 bit lines per block. These bit lines are 2:1 interleaved, so that each of the column decoder and data I/O circuits at the top and bottom of an array block interfaces to 576 bit lines. Other numbers and arrangements of such bit lines and array blocks, including higher numbers, are also contemplated.

In a selected memory array block, one of these source selection bus lines XSELN (or reverse source selection bus XSELP) is decoded and driven to an active bias condition by a row bias circuit, and remaining bus lines (also called "bias lines") are driven to an inactive condition (i.e., a voltage suitable for an unselected word line). Consequently, a single selected RSEL line (i.e., row select line, which corresponds to the decoded output node 158 in FIG. 3) drives one word line low in the selected memory block, and drives the other N−1 word lines in the selected block to an unselected bias level. In other non-selected memory blocks, none of the individual bus lines of the source and reverse source selection busses are driven active, so that no word lines are selected by the active RSEL line. Alternatively, the source and reverse source selection busses in unselected array blocks may be left floating, particularly in the forward mode.

Each row select line traverses across all the memory blocks in the entire memory stripe, and drives a respective four-headed word line driver located "between" each pair of blocks of the stripe (as well as two more, each respectively located "outside" the first and last blocks). The RSEL lines may also be known as "global row lines", and may also correspond to the row decoder output nodes referred to herein. Additional details of exemplary circuits, operation, bias conditions, float conditions, modes of operation including read and program modes, and the like, are further described in the aforementioned U.S. Pat. No. 6,879,505, and additionally described in U.S. Pat. No. 7,054,219 to Christopher J. Petti, et al., entitled "Transistor Layout Configuration for Tight-Pitched Memory Array Lines", the disclosure of which is hereby incorporated by reference in its entirety, and further in U.S. application Ser. No. 11/146,952 filed on Jun. 7, 2005 by Roy E. Scheuerlein, et al., entitled "Decoding Circuit for Non-Binary Groups of Memory Line Drivers", now U.S. Pat. No. 7,272,052, the disclosure of which is hereby incorporated by reference in its entirety.

To speed up the selection time of a global row line, these RSEL lines are driven at both ends thereof by two hierarchical row select decoders 302, 304 (also known as "global row decoders 302, 304"), each respectively located outside the array at left and right sides of the array stripe. By using a hierarchical decoder structure the size of the global row decoder 302 is reduced, thus improving the array efficiency. In addition, a reverse decoding mode may be conveniently provided for improved testing capability, as further described in "Dual-Mode Decoder Circuit, Integrated Circuit Memory Array Incorporating Same, and Related Methods of Operation" by Kenneth K. So, et al., U.S. application Ser. No. 11/026,493 filed Dec. 30, 2004, now U.S. Pat. No. 7,298,665, the disclosure of which is hereby incorporated by reference in its entirety. Exemplary circuits for such hierarchical decoders may be found in "Apparatus and Method for Hierarchical Decoding of Dense Memory Arrays Using Multiple Levels of Multiple-Headed Decoders," by Luca G. Fasoli, et al., U.S. Patent Application Publication No. 2006-0146639 A1, now U.S. Pat. No. 7,286,439, the disclosure of which is hereby incorporated by reference in its entirety.

In certain materials incorporated herein, an exemplary four-headed decoder circuit includes four "selected" bias lines and a single unselected bias line. The rationale for such a name is because a given decoder head couples its output to a "selected" bias line if the input to the decoder head is selected (i.e., driven to an active level). However, by no means does this imply that all four of the heads shown drive their respective outputs to a level that is reflective of the output being selected, because typically only one of the selected bias lines is actually biased in a condition suitable for a selected output, and the remaining three selected bias lines are biased in a condition suitable for an unselected output. These "selected" bias lines for a multi-headed decoder are described herein as a "source selection bus," but operate similarly, except as noted. Some embodiments also include a second such bus, being a "reverse source selection bus" rather than a single unselected bias line.

Conversely, if the input node for the multi-headed decoder is inactive or unselected, then all such heads drive their respective outputs to an associated "unselected" bias line (or respective bus line of a reverse source selection bus). For many useful embodiments, such unselected bias lines may be combined into a single bias line shared by all heads of the multi-headed decoder.

Similar or related word line decoder structures and techniques, including additional hierarchical levels of such decoding, bias circuit organization for the decoded busses (e.g., XSELN and XSELP), and related supporting circuits, are further described in U.S. Pat. No. 6,856,572 by Roy E. Scheuerlein and Matthew P. Crowley, entitled "Multi-Headed Decoder Structure Utilizing Memory Array Line Driver with Dual Purpose Driver Device", the disclosure of which is hereby incorporated by reference in its entirety, and in U.S. Pat. No. 6,859,410 by Roy E. Scheuerlein and Matthew P. Crowley, entitled "Tree Decoder Structure Particularly Well-Suited to Interfacing Array Lines Having Extremely Small Layout Pitch", the disclosure of which is hereby incorporated by reference in its entirety.

Figure 12:
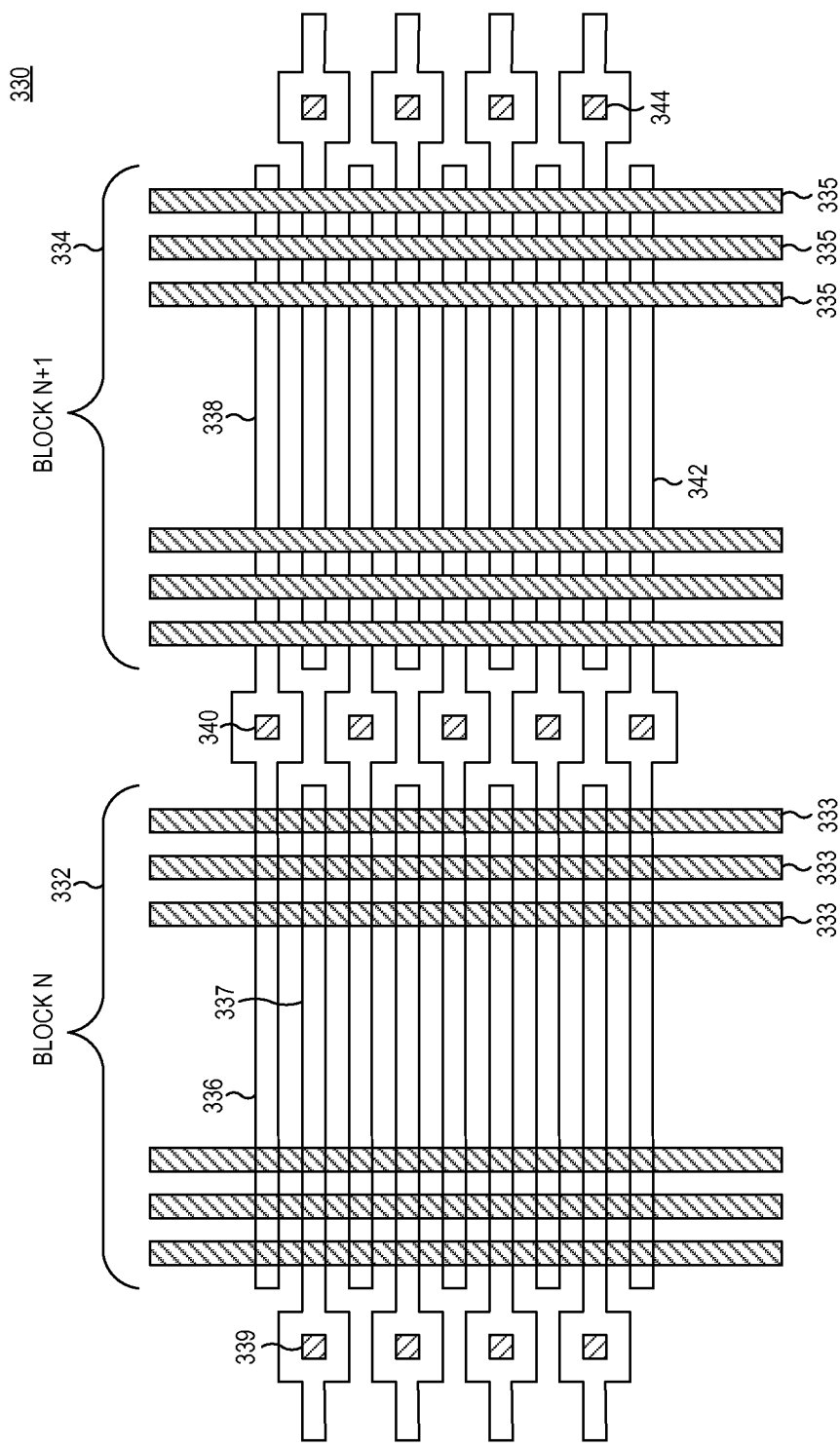
FIG. 12 is a top view representing a word line layer and a bit line layer of a three-dimensional memory array in accordance with certain embodiments of the present invention, which shows 2:1 interleaved word line segments, where vertical connections to half of the word line segments for a block are on the left side of the block, and vertical connections to the other half of the word line segments for the block are on the right side of the block. In addition, a word line segment from two adjacent blocks shares each vertical connection.

FIG. 12 is a top view representing a word line layer and a bit line layer of a three-dimensional memory array in accordance with certain embodiments of the present invention. Other word line layers and bit line layers may be implemented with those shown and would, in some embodiments, share the same vertical connections. Memory blocks 332, 334 are shown respectively including a plurality of bit lines 333, 335, and having 2:1 interleaved word line segments. Vertical connections to half of the word line segments for a block are on the left side of the block (e.g., word line segment 337 and vertical connection 339), and vertical connections to the other half of the word line segments for the block are on the right side of the block (e.g., word line segment 336 and vertical connection 340). In addition, each vertical connection serves a word line segment in each of two adjacent blocks. For example, vertical connection 340 connects to word line segment 336 in array block 332 and connects to word line segment 338 in array block 334. In other words, each vertical connection (such as vertical connection 340) is shared by a word line segment in each of two adjacent blocks. As would be expected, however, the respective "outside" vertical connections for the first and last array blocks may serve only word line segments in the first and last array blocks. For example, if block 334 is the last block of a plurality of blocks forming a memory array (or a memory bay), its outside vertical connections (e.g., vertical connection 344) may serve only the word line segment 342 within block 334, and are thus not shared by two word line segments as throughout the remainder of the array.

By interleaving the word line segments as shown, the pitch of the vertical connections is twice the pitch of the individual word line segments themselves. This is particularly advantageous since the word line pitch which is achievable for many passive element memory cell arrays is significantly smaller than achievable for many via structures which might be employed to form the vertical connections. Moreover, this also may reduce the complexity of the word line driver circuitry to be implemented in the semiconductor substrate below the memory array.

Figure 13:
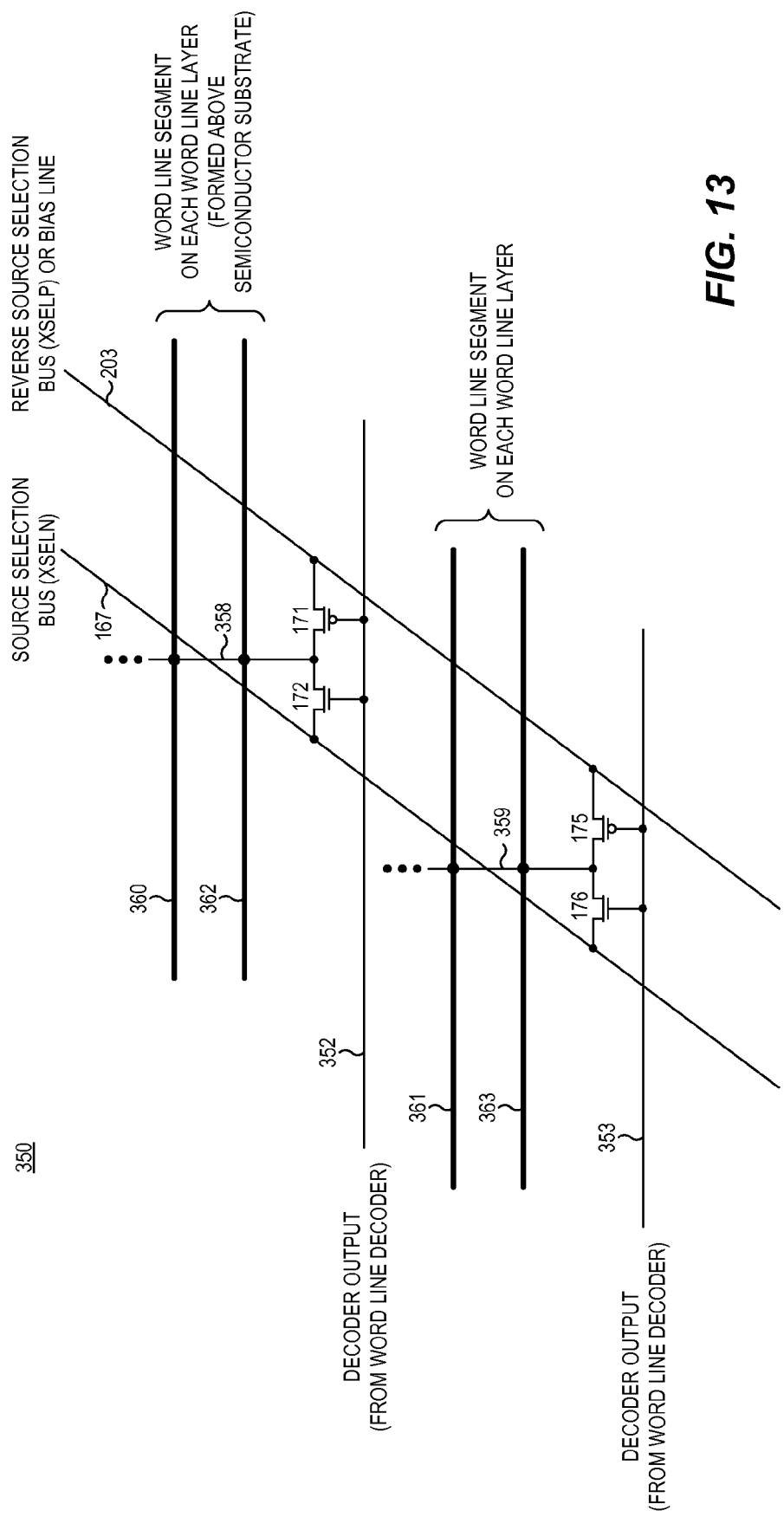
FIG. 13 is a three-dimensional view depicting a portion of a three-dimensional memory array, consistent with certain embodiments of that illustrated in FIG. 12, and illustrating a word line driver circuit coupled by way of a vertical connection to a respective word line segment in each of two adjacent array blocks, and on each of two or more word line layers.

Referring now to FIG. 13, a schematic diagram is shown representing a three-dimensional memory array having a segmented word line arrangement in accordance with certain embodiments of the present invention. Each word line is formed by one or more word line segments on at least one, and advantageously more than one, word line layer of the memory array. For example, a first word line is formed by word line segment 360 disposed on one word line layer of the memory array and by word line segment 362 disposed on another word line layer. The word line segments 360, 362 are connected by a vertical connection 358 to form the first word line. The vertical connection 358 also provides a connection path to driver devices 171, 172 disposed in another layer (e.g., within the semiconductor substrate). A decoded output 352 from a row decoder (not shown) traverses substantially parallel to the word line segments 360, 362 and, at times, couples the word line segments 360, 362 through device 172 to a decoded bias line 167 (e.g., source selection bus XSELN) which traverses substantially perpendicular to the word line segments, and at other times, couples the word line segments 360, 362 through device 171 to a decoded bias line 203 (e.g., reverse source selection bus XSELP shown in FIG. 9).

Also shown are word line segments 361, 363 which are connected by a vertical connection 359 to form a second word line and to provide a connection path to the word line driver circuit 175, 176. Another decoded output 353 from the row decoder couples, at times, these word line segments 361, 363 through device 176 to the decoded source select line (i.e., "bias line") 167, and at other times, couples the word line segments 361, 363 through device 175 to the decoded bias line 203. While this figure conceptually introduces an exemplary array configuration, many embodiments are described herebelow which include variations to the configuration shown, and moreover include details which may be appropriate for certain embodiments but not necessarily for all embodiments.

In certain preferred embodiments, a six-headed word line driver is utilized. The six word lines associated with such a six-headed word line driver circuit are common to two adjacent memory blocks, as described in the aforementioned U.S. Pat. No. 7,054,219. In other words, a given six-headed word line driver decodes and drives six word lines in each of two adjacent blocks. As implied by the figure, these adjacent blocks may be viewed as being respectively to the left and to the right of the associated word line drivers. However, in preferred embodiments such multi-headed word line drivers are disposed substantially beneath the array blocks, and only the vertical connections to the word lines made between the blocks.

Certain embodiments are contemplated having non-mirrored arrays (e.g., a word line layer associated with only a single bit line layer), such as is described in U.S. application Ser. No. 11/095,907 filed Mar. 31, 2005, by Luca G. Fasoli, et al., entitled "Method and Apparatus for Incorporating Block Redundancy in a Memory Array", now U.S. Pat. No. 7,142,471, the disclosure of which is hereby incorporated by reference in its entirety. In particular, FIG. 15 shows 4 bit line layers, a 16-headed column decoder on both the top and the bottom sides of an array block. This figure shows 4 bit lines on each of 4 bit line layers being coupled by a single 16-headed column decoder to the top data bus (describing 4 I/O layers), and likewise 4 bit lines on each of the same 4 bit line layers being coupled by a single 16-headed column decoder to the bottom data bus (although in that description, the two groups of 16 selected bit lines were located within the same array block). Other half-mirrored embodiments are contemplated, such as those sharing a word line layer with two bit line layers, to form two memory planes.

In the next several figures, various embodiments are described which utilize reset programming (i.e., reverse bias programming). Consequently, a few definitions are in order for this portion of the disclosure. The term "set" shall be viewed as forward biasing a single (or group of) memory cells, to cause a lower resistance through each memory cell. The term "erase" shall be viewed as forward biasing a block of memory cells, to cause a lower resistance through each memory cell. Lastly, the term "reset" shall be viewed as reverse biasing a memory cell to cause a higher resistance through each such cell. (With regard to other embodiments described herein such definitions may not apply. In particular, the term "erase" may also refer to a reverse bias condition across a memory cell to increase the resistance of the cell.)

Figure 14:
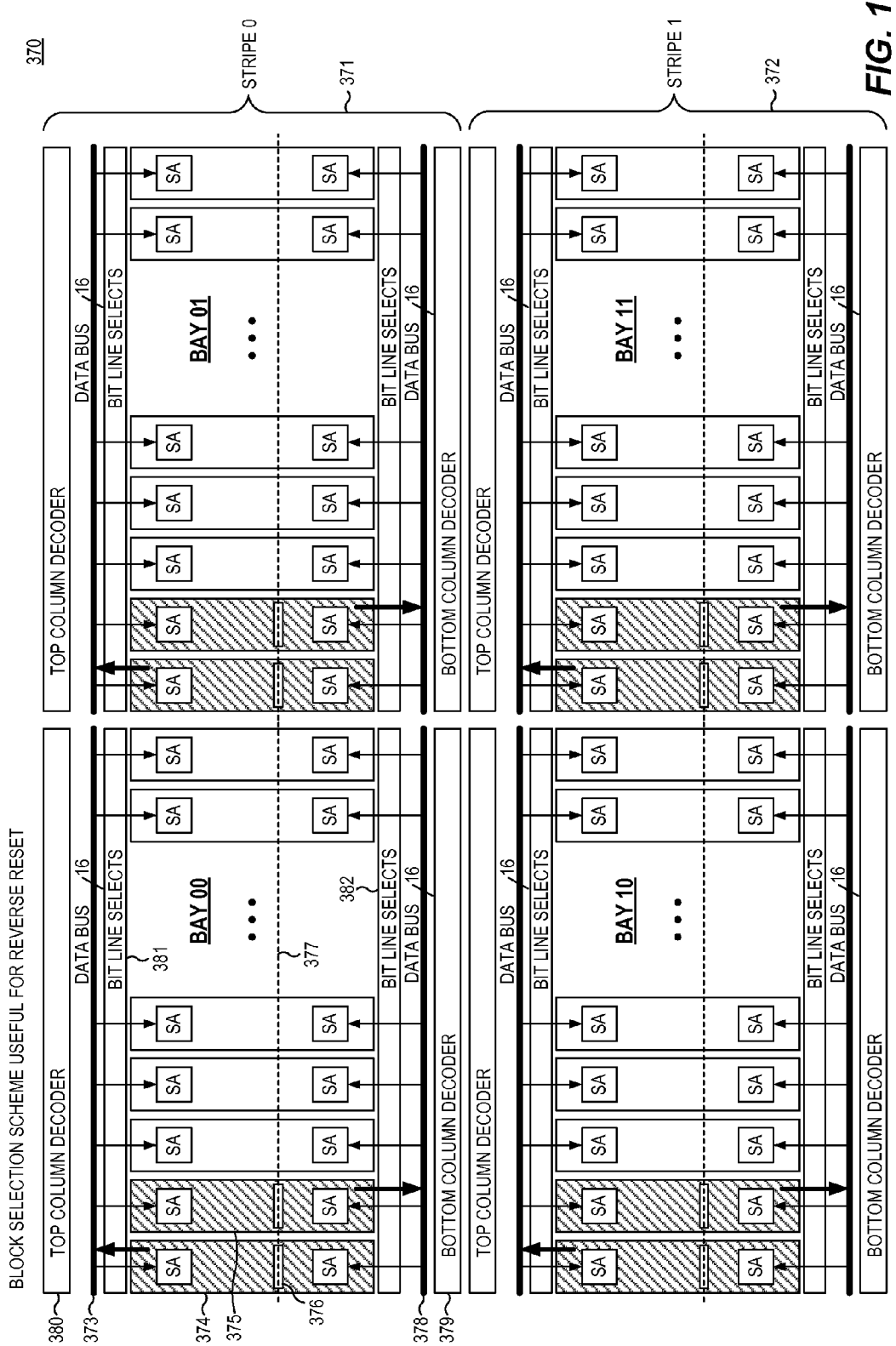
FIG. 14 is a block diagram of a memory array, illustrating two memory stripes, each having two (or more) memory bays, and each bay including a plurality of memory array blocks. Two array blocks are shown as being simultaneously selected, each coupling its respective bit lines to a respective one of two data busses associated with the memory bay.

Referring now to FIG. 14, a memory array 370 includes a first stripe 371 and a second stripe 372. The first stripe 371 is also labeled STRIPE 0 and the second stripe 372 is also labeled STRIPE 1. Stripe 371 includes two memory bays, BAY_00 and BAY_01. Each such memory bay includes a plurality of array blocks (e.g., 16 such memory array blocks). While this exemplary memory array 370 is shown including two memory stripes, each having two memory bays, other numbers of stripes and bays are also contemplated.

The first memory bay, BAY_00 is representative of the other memory bays. A total of 16 memory array blocks are represented, two of which are labeled as 374 and 375, each having a sense amplifier disposed below the memory array (e.g., in the semiconductor substrate layers, whereas one or more memory planes may be formed above a dielectric layer formed on the substrate layers). A top column decoder circuit 380, a top data bus 373, and a top bit line select block 381 span across the 16 array blocks of this bay, and are associated with those bit lines exiting the top side of each array block. A bottom column decoder circuit 379, a bottom data bus 378, and a bottom bit line select block 382 span across the 16 array blocks of this bay, and are associated with those bit lines exiting the bottom side of each array block.

It should be understood that the top column decoder circuit 380 may be described as being "above" the array blocks, while the bottom column decoder circuit 379 may be described as being "below" the array blocks. This terminology reflects visually the orientation of the circuit blocks as depicted in the schematic diagrams. Such locations may also be described as "to one side" and "to the opposite side" of the array blocks (although admittedly this implies a horizontal substrate for the integrated circuit upon which this circuit is implemented). In addition, the directional terms "north" and "south" are convenient terms for describing the positional relationships of various circuit blocks.

In contrast, in certain embodiments the memory array may be formed "above" the substrate, and various circuit blocks being described as being "below" the memory array. As used herein, being "above" or "below" the substrate or a memory array block, which are actual physical structures having generally a planar character, is relative to a direction normal to the surface of such a substrate or memory plane.

In FIG. 14, although the bottom column decoder may be described as being "below" the array blocks, such a column decoder is not necessarily beneath the memory array (i.e., closer to the substrate). In contrast, the sense amplifier blocks labeled SA which are depicted as within the array block boundary, and are described as being "below" or "beneath" the array block, may be assumed to convey such a physical location and structural relationship. In the context of the description and various figures, the usage of "above" and "below" should be clear.

In certain exemplary embodiments, the bit line decoders are 16-headed decoders, and simultaneously select 16 bit lines on the top side of a selected memory array block. This "selection" is in regards to the column decoding, and does not necessarily imply that all 16 bit lines are actually programmed at the same time. The sixteen selected bit lines are preferably arranged as four adjacent bit lines which exit the array at the top (or the bottom for the other decoder), on each of four bit line layers.

The sixteen I/O lines of the top data bus 373 traverse horizontally across all sixteen blocks. Such a bus corresponds to the SELB bus described above. Each of the individual bus lines of this data bus 373 is coupled to a respective one of sixteen sense amplifier circuits which are distributed among the sixteen blocks as shown. Each of the sixteen data bus lines may also be coupled to an associated bias circuit (i.e., a reset circuit), which may be used during a particular mode of operation to properly bias the respective bit lines within the "selected" 16 bit lines. For example, for a reset programming mode of operation, such a reset circuit properly biases those bit lines to be programmed and those bit lines not to be programmed within the "selected" 16 bit lines, in accordance with the data bit for each of the 16 bit lines, and also in accordance with the number of bit lines which are allowed to be simultaneously programmed (meaning, of course, the cell to be programmed which is coupled to the particular bit line). These bias circuits may be disabled and caused to exhibit a high output impedance during a read mode of operation when the selected bit lines are coupled to respective sense amplifiers by way of the data bus 373 (i.e., the SELB bus described above).

The sixteen I/O lines of the bottom data bus 378 traverse horizontally across all sixteen blocks. Such a bus corresponds to another SELB bus described above, this time for the bit lines exiting at the bottom of the array (remembering that the bit lines are 2:1 interleaved). As before, each of the individual bus lines of this data bus 378 is coupled to a respective one of sixteen sense amplifier circuits which are distributed among the sixteen blocks as shown. In every group of 16 blocks (i.e., a bay) there are 32 sense amplifiers which connect to 32 selected bit lines. In the read mode, all the select bit lines may be arranged to fall within one of the sixteen blocks, or may be arranged otherwise, as will be discussed here. The sense amplifiers may be conveniently implemented beneath the memory array block, whereas the data bus lines 373, 378, the sixteen-headed column select decoders (i.e., the bit line select blocks 381, 382), and a small portion of the column decoders 379, 380 are preferably implemented outside the array block.

Additional details of useful column decoder arrangements may be found in the aforementioned U.S. application Ser. No. 11/095,907 (now U.S. Pat. No. 7,142,471), and in the aforementioned U.S. Patent Application Publication No. 2006-0146639 A1 (now U.S. Pat. No. 7,286,439).

In a programming mode, the magnitude of the total programming current may limit the number of simultaneously programmed memory cells. In addition, the magnitude of the programming current which flows along a single selected bit line or word line may also limit the number of memory cells which may reliably be programmed at the same time. In the exemplary architecture shown, if both column decoders select bit lines in the same array block, there would be 32 total bit lines selected with one array block. Assuming each decoder selects four bit lines from each of four bit line layers (i.e., four bit lines from each respective memory plane), then the selected word line segment on each memory plane would have to support the programming current for a total of eight selected memory cells. (See FIG. 13 to show individual word line segments per layer.) Four of these selected memory cells are associated with bit lines exiting to the north, and the other four selected memory cells are associated with bit lines exiting to the south. All 32 of the selected memory cells would be driven by the same word line driver circuit, whereas each of the selected memory cells is driven by its own bit line driver circuit.

As implied above, even if the total programming current for 32 cells could be supplied by the integrated circuit, the programming current for 8 selected memory cells may cause an unacceptable voltage drop along the selected word line segments on each layer. In addition, the selected word line driver circuit may not be capable of driving such current with acceptable voltage drop.

In a reset programming mode, a reverse bias is applied to each selected passive element cell, whereby the modifiable resistance material is reset to a high resistance state to program user data. One or more bit lines in a block may be selected for simultaneous programming, and as some of the bits reset to a higher resistance state, the current flowing from the selected bit line to the selected word line decreases significantly, and the remaining bits see a slightly higher voltage due to decreasing word line IR drops. As a result, the bits that program more easily change state first, which allows the more "stubborn" bits to see a slightly higher voltage to help program such bits.

Nonetheless, having all 32 selected memory cells reside in the same array block may be unacceptable for either of the reasons stated above. Consequently, two different array blocks may be selected for programming, each using a respective one of the two data busses. In the figure, the array block 374 is cross-hatched to signify its selection for reset programming. One of the top column decoder 380 outputs for block 374 is active, thus coupling 16 selected bit lines to the top data bus 373 (signified by the arrowhead from the array block 374 to the data bus 373). In addition, the array block 375 is cross-hatched to signify its selection for reset programming. One of the bottom column decoder 379 outputs for block 375 is also active, thus coupling 16 selected bit lines to the bottom data bus 378 (signified by the arrowhead from the array block 375 to the data bus 378).

A single row 377 is selected by the global row decoders on either side of the memory array (not shown), which drives a global row select line across the entire stripe 371. Such a global row select line corresponds to the decoded output 158 of the row decoder circuit shown in FIG. 9. A multi-headed word line driver circuit is enabled (by appropriate bias conditions on its source selection bus and reverse source selection bus) to drive a selected word line 376 in block 374, and a selected word line in block 375. Since the word lines in this exemplary embodiment are shared, one such selected word line driver circuit drives the word line in both blocks 374, 375. The entire programming current is still sourced through this one selected word line driver circuit, but now the current along each selected word line segment is reduced in half, as each word line segment now supports only 4 selected memory cells. Note the next higher or lower word line in blocks 374 and 375 are driven by two separate word line driver devices and the peak current in either of the wordline driver devices would be about half. By choosing to arrange the pages of data in a more complex arrangement of blocks corresponding to odd or even word lines, shared word line drivers can be avoided entirely. For example, assume that even word lines are driven from the left side of a given array block, and that odd word lines are driven from the right side of a given array block. When an even word line is selected in the given array block, the block to its left may be simultaneously selected, and when an odd word line is selected in the given array block, the block to its right may be simultaneously selected. In such a case, no selected word lines appear in an unselected array block. In an alternate embodiment, the page of data to be written may be arranged to avoid shared word line drivers.

In the above dual data bus example, each memory block is associated with both data busses 373, 378. In a different memory cycle, other bit lines associated with array block 374 would be coupled to the bottom data bus 378, and other bit lines associated with array block 375 would be coupled to the top data bus 373. In this and other embodiments, to optimize performance the blocks selected for read in a given bay are different than the blocks selected for reset. A single block is selected at a time for read, but two blocks are selected for reset. The two data busses are both active for read but access a single block, unlike the reset access described above.

There are a variety of other dual data bus arrangements that provide similar benefit. FIG. 15 shows a memory bay 400 in which the odd memory blocks are associated with only a first data bus, and the even memory blocks are associated with only a second data bus. Odd array block 406 is associated with the first data bus 402, which is represented by the bit line select block 408, and even array block 407 is associated with the second data bus 404. Two memory array blocks (e.g., array blocks 406, 407) are simultaneously selected, each coupling its selected bit lines to one of the data busses (represented by respective bold arrows 410, 412).

FIG. 16 shows a memory bay 420 in which each memory block is associated with both a first data bus 422 and a second data bus 424. In one depicted memory cycle, the first array block 426 is selected and couples (bold arrow 430) its selected bit lines to the first data bus 422, while the second array block 427 is simultaneously selected and couples (bold arrow 432) its selected bit lines to the second data bus 424. In another memory cycle, the first array block 426 could be selected and couples its selected bit lines to the second data bus 424, while the second array block 427 is simultaneously selected and couples its selected bit lines to the first data bus 422.

Figure 17:
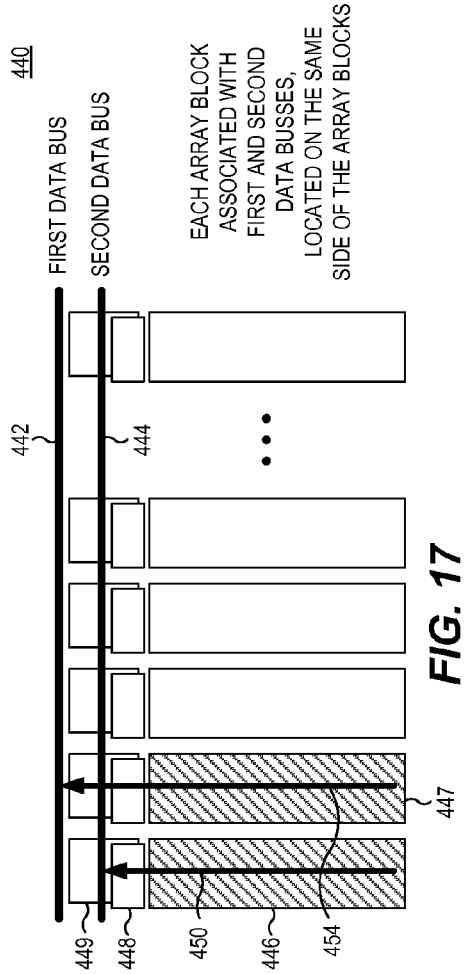
FIG. 17 is a block diagram of a memory bay, illustrating another arrangement in which two array blocks are shown as being simultaneously selected, each coupling its respective bit lines to a respective one of two data busses associated with the memory bay, which busses are disposed on the same side of the memory array blocks.

FIG. 17 shows a memory bay 440 in which each memory block is associated with both a first data bus 442 and a second data bus 444, which are both located on the same side of the array blocks. The first array block 446 is associated with the first data bus 442 by virtue of a first bit line select block 449, and is also associated with the second data bus 444 by virtue of a second bit line select block 448. In the exemplary memory cycle shown, two memory array blocks (e.g., array blocks 447, 446) are simultaneously selected, each respectively coupling its selected bit lines to the first and second data busses 442, 444 (represented by respective bold arrows 450, 454).

Figure 18:
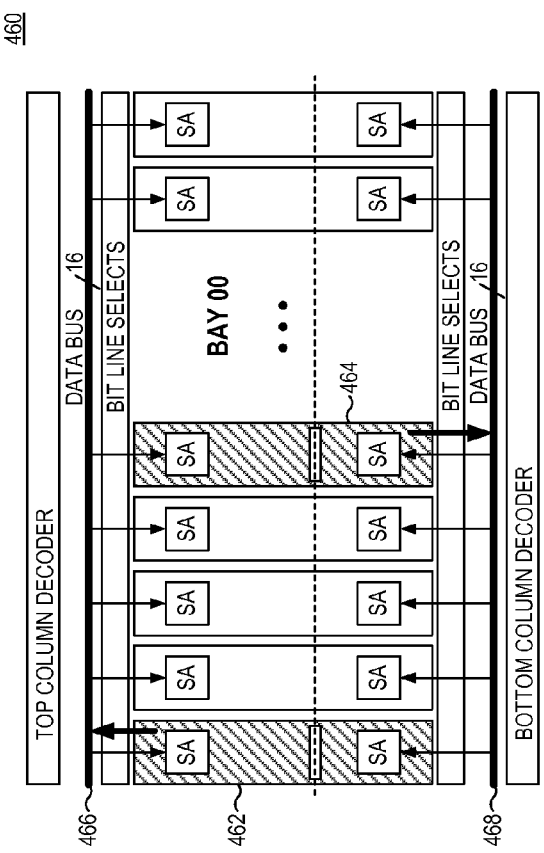
FIG. 18 is a block diagram of a memory bay, illustrating another arrangement in which two non-adjacent array blocks are shown as being simultaneously selected, each coupling its respective bit lines to a respective one of two data busses associated with the memory bay.

Referring now to FIG. 18, a memory bay 460 is depicted which is similar to the memory bay BAY_00 shown above, except in this exemplary embodiment, two simultaneously selected array blocks 462, 464 are non-adjacent. In one depicted memory cycle, array block 462 is selected and couples (i.e., the bold arrow) its selected bit lines to an upper data bus 466, while array block 464 is simultaneously selected and couples its selected bit lines to a lower data bus 468. This organization is particularly useful if the word lines are not shared between adjacent memory aray blocks, but can be used even if such word lines are shared. In such a case, a selected word line in a selected block will also hang over into the adjacent memory block.

In each of these illustrated embodiments, more than one block is selected for reset programming. Reverse bias is applied to the passive element cells in the selected array blocks (i.e., selected "sub arrays") whereby the modifiable resistance material is reset to a high resistance state to program user data into the array. This may be accomplished at high bandwidth for at least several reasons. First, by selecting more than one block for programming, the number of simultaneously programmed memory cells can be increased beyond the limits imposed by a given word line segment, or even by a given word line driver circuit. More than two selected array blocks could be selected, as long the data busses reach each such block. In addition, the direction of programming assists in allowing a greater number of cells to be programmed. In other words, as some of the programmed bits reset to a higher resistance state, the magnitude of the current flowing from the bit line to the word line drops significantly, and the remaining bits see slightly higher voltage due to decreasing word line IR drops. For a given maximum programming current, it is likely possible to reliably program more bits from low to high resistance than from high to low resistance. Also contributing to a high bandwidth programming is the bias conditions on all the large number of unselected word lines and bit lines. Since these all remain at ground, there are not large delays associated with biasing up the unselected array lines as array blocks are selected and deselected, nor are there large current transient currents that must be accommodated to bias up and down such array blocks. Of note, in this reset programming arrangement, even the unselected word lines and bit lines in the selected memory block are biased at ground (i.e., left floating when using certain exemplary decoder structures).

In exemplary embodiments, a memory chip may be organized so that each bay has its own set of read write circuits and at least one data bus connecting the read/write circuits to the bit line select circuitry. This bus extends across the width of the bay, or in other words "spans" the group of blocks. There may be a column decoder at the top side of the blocks and a second column decoder at the bottom side of the blocks so that there are two data busses. In certain embodiments, there may be two sets of read write circuits associated with each respective data bus. Preferably a particular page of data is spread to all the bays for highest bandwidth. This is depicted in the exemplary embodiment shown in FIG. 14 by a pair of selected array blocks within each memory bay.

Preferably the selected bits are distributed over two blocks in a bay, one block having bit lines selected by one of the column decoders and associated with one of the data busses, and the second block selected by the other column decoder and data bus so that the bandwidth is doubled per bay, but the current flowing in any one word line segment is unchanged. In addition, one or many of the bit lines at a selected column location are selected for reset programming simultaneously. The number simultaneously programmed may be limited by the current flowing from the selected bit lines in a block to the common word line. But this limitation is mitigated in a method where, as some of the bits reset to a higher resistance state, the current through the "already reset" cell decreases, the IR drop along the common word line segment decreases, and remaining bits get more voltage to encourage their reset.

The selected word lines in each selected block are preferably all on the same row, which eases decoding implications because the global row decoder circuit needs no change to support this. Preferably the simultaneously selected blocks are adjacent, particularly if word lines are shared between adjacent blocks. The decoding may be arranged so that, for any selected word line shared between two adjacent blocks, these two adjacent array blocks may be configured to be the simultaneously selected array blocks. For example, a given word line driver disposed between the first and second blocks drives a shared word line in the first and second blocks, which are both selected. The next word line (assuming they are 2:1 interleaved form left and right sides of the array blocks) would be driven from an array line driver between the second and third array blocks, which could also be the selected array blocks. This avoids dealing with selected word lines hanging over into adjacent non-selected array blocks.

When using reset programming, each memory cell is set back to a low resistance state by the "set" mode of operation, which may be used to rewrite new data, or erase a group of bits, by applying forward bias to one bit at a time, or many bits in a page of data or an erase block. High performance erase may be achieved by selecting multiple bit lines and or multiple word lines in a block, and setting the cells to low resistance. Current limiting circuitry in the bit line driver path limits the total current flowing to the common word line. Depending upon the memory cell technology chosen, and the relative magnitude of the set current and reset current, and the magnitude of U cell leakage current, fewer blocks may be selected for the set or erase operation than for reset (i.e., programming).

One choice of resistive material is the polysilicon material that forms the diode. An antifuse ("AF") can be in series with the polysilicon diode, and the antifuse is popped before the programming event in a formatting step in manufacturing. The antifuse serves to limit the maximum current that the cell will conduct when set.

As stated above, preferably the memory array includes a segmented word line architecture (as depicted in FIGS. 12 and 13), and preferably a 3D array. In certain embodiments, the word lines on a given word line layer are associated with bit lines on a single bit line layer, while in certain embodiments the word lines on a given word line layer are shared between two bit line layers (i.e., a single word line layer and two bit line layers defining two memory planes) in a so-called "half-mirrored" arrangement. Such a memory array structure is described further in the aforementioned U.S. Pat. No. 6,879,505.

The description of the various decoder circuits thus far has largely focused on describing a single array block. Recall that each decoder has been described in the context of a source selection bus and, for some of the embodiments, a reverse source selection bus. The word line decoder hierarchy may be viewed as relatively straightforward. The source selection bus and unselected bias line, or alternatively the reverse source selection bus, are decoded based upon address information, and driven according to which array block is active. Similar row decoder circuits are referred to already elsewhere herein.

The respective source selection bus(ses) and/or unselected bias lines for word lines associated with unselected array blocks may be left floating.

As for the column decoder arrangements, a hierarchical bus arrangement may be employed to provide efficient routing of read/write data, and efficient biasing of bit lines within selected and unselected array blocks. Useful hierarchical bus arrangements will be described in the context of the dual source selection bus decoders depicted in FIGS. 9 and 10, although these may be adapted for the other decoder embodiments.

In the forward operations (read and set) an exemplary hierarchical bus arrangement provides a suitable bias on the SELN bus for a selected array block, and leaves the SELN bus for unselected array blocks floating. This is helpful to reduce unwanted power dissipation in the array blocks adjacent to a selected array block. The unselected word lines in a selected array block are biased at a fairly high voltage VUX (e.g., VPP−VT), and with a shared word line architecture these unselected word lines also extend to the adjacent non-selected array block (i.e., half of the word lines within the non-selected array block being shared with the selected array block). The unselected bit lines in the adjacent array block preferably are biased at the unselected bit line voltage, VUB (e.g., VT). This wastes power due to the leakage currents through unselected memory cells. The other half of the word lines in the adjacent non-selected array block are floating, so that they leak up to the VUB voltage, and leakage power is minimized for half of the unselected cells.

The exemplary hierarchical bus arrangement also provides, in a reset mode of operation, a long SELN path spanning many blocks to reach the reset data drivers distributed under the array blocks.

Figure 19:
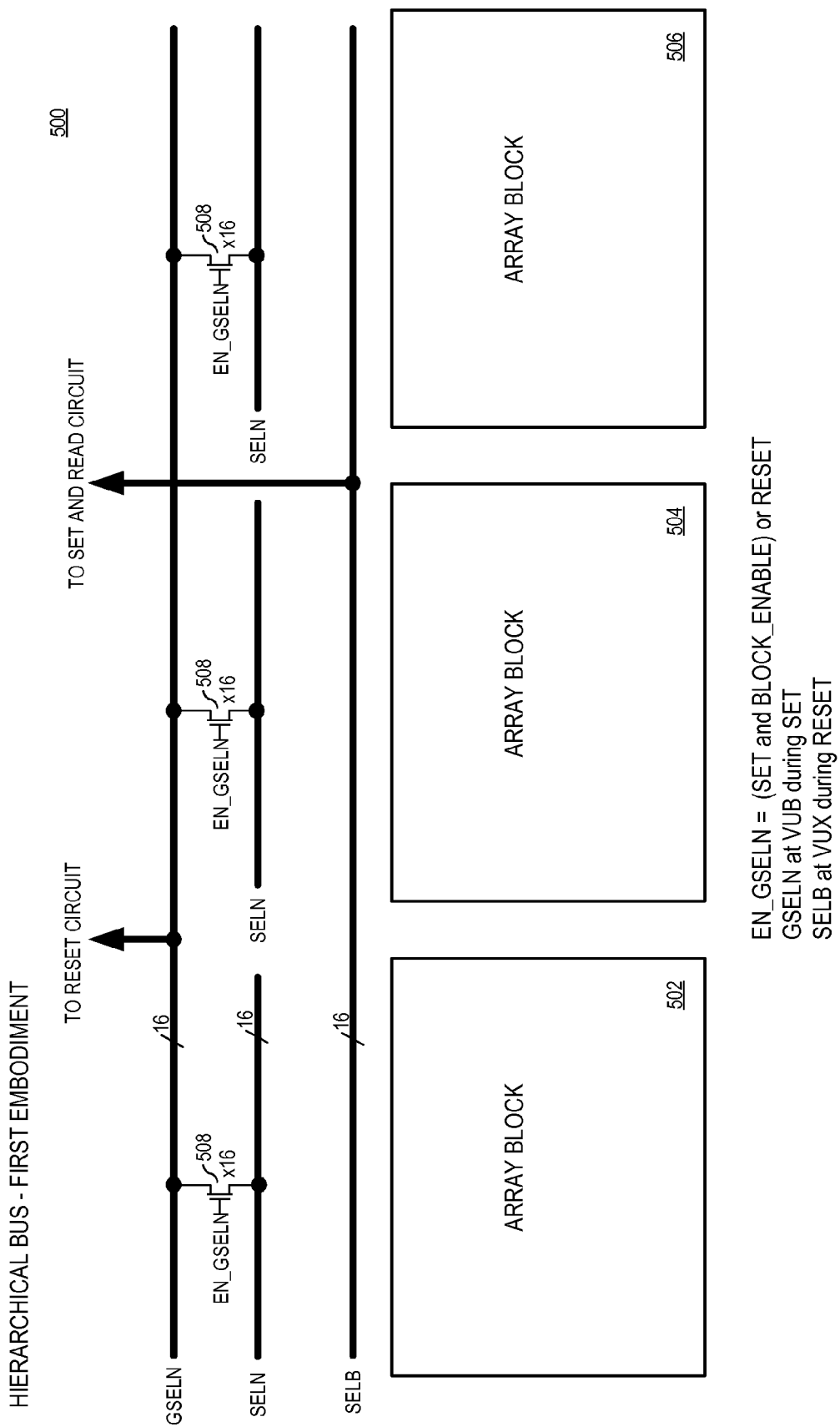
FIG. 19 is a block diagram of a portion of a memory bay, illustrating an exemplary hierarchical decoding arrangement for providing appropriate conditions on the source selection busses for the selected and unselected array blocks.

Four exemplary hierarchical bus arrangements are depicted in the next four figures. Referring now to FIG. 19, a bus arrangement 500 is depicted and includes three memory array blocks 502, 504, 506, which represent all the array blocks in a bay. While only three array blocks are shown, the incremental nature of the arrangement will be clear, as will its extendibility to any number of array blocks. A respective SELN bus segment is shown for each respective array block. As used herein, a bus segment is merely a smaller bus than other such busses, and in other embodiments (described below), multiple bus segments may be coupled together to form single larger bus.

In the set mode, the SELN bus segment for a selected array block is coupled to a longer GSELN bus which spans the entire memory bay by a coupling circuit 508. This coupling circuit 508 may be as simple as 16 transistors, each coupling a respective SELN bus line to the respective GSELN bus line. This coupling circuit 508 is enabled by a control signal EN_GSELN, which is active for the selected array block when in the set mode, or in the reset mode (discussed below). During the set mode, this GSELN bus is coupled to the unselected bit line voltage VUB (i.e., each bus line of the GSELN bus is coupled to this voltage). The respective EN_G-SELN control signal for the unselected array blocks is inactive, the respective coupling circuit 508 turned off, and thus the respective SELN bus segment left floating, as desired.

In the reset mode, the respective EN_GSELN control signal for all array blocks is active, and the respective coupling circuit 508 is turned on to couple the respective SELN bus segment to the GSELN bus. This provides the write data to all array blocks, irrespective of which is selected. The SELB bus is driven to the VUX voltage (e.g., ground) to provide the unselected bit line bias condition for reset programming.

This is a relatively simple circuit arrangement that only requires an additional 16 global lines (GSELN) and 16 extra transistors per array block (the coupling circuit 508). Disadvantages (at least relative to other embodiments described below) include a relatively high capacitance on both the SELB and SELN busses. The capacitance on the SELB bus exists at all times, but is detrimental only during a read cycle, whereas the high capacitance on the SELN bus exists during the reset mode when all the SELN bus segments are coupled to the global bus GSELN, during which time the combined busses convey the reset data information.

In certain other embodiments, the reset mode may be configured with entirely non-negative voltages, rather than splitting the reset voltage VRR into −VRR/2 and +VRR/2. In such cases, the unselected word lines and bit lines are biased at the midpoint, which is now VRR/2. Consequently, when coming out of reset mode, care should be exercised to control the rate of discharge of these lines to avoid excessive current surges when discharging.

Figure 20:
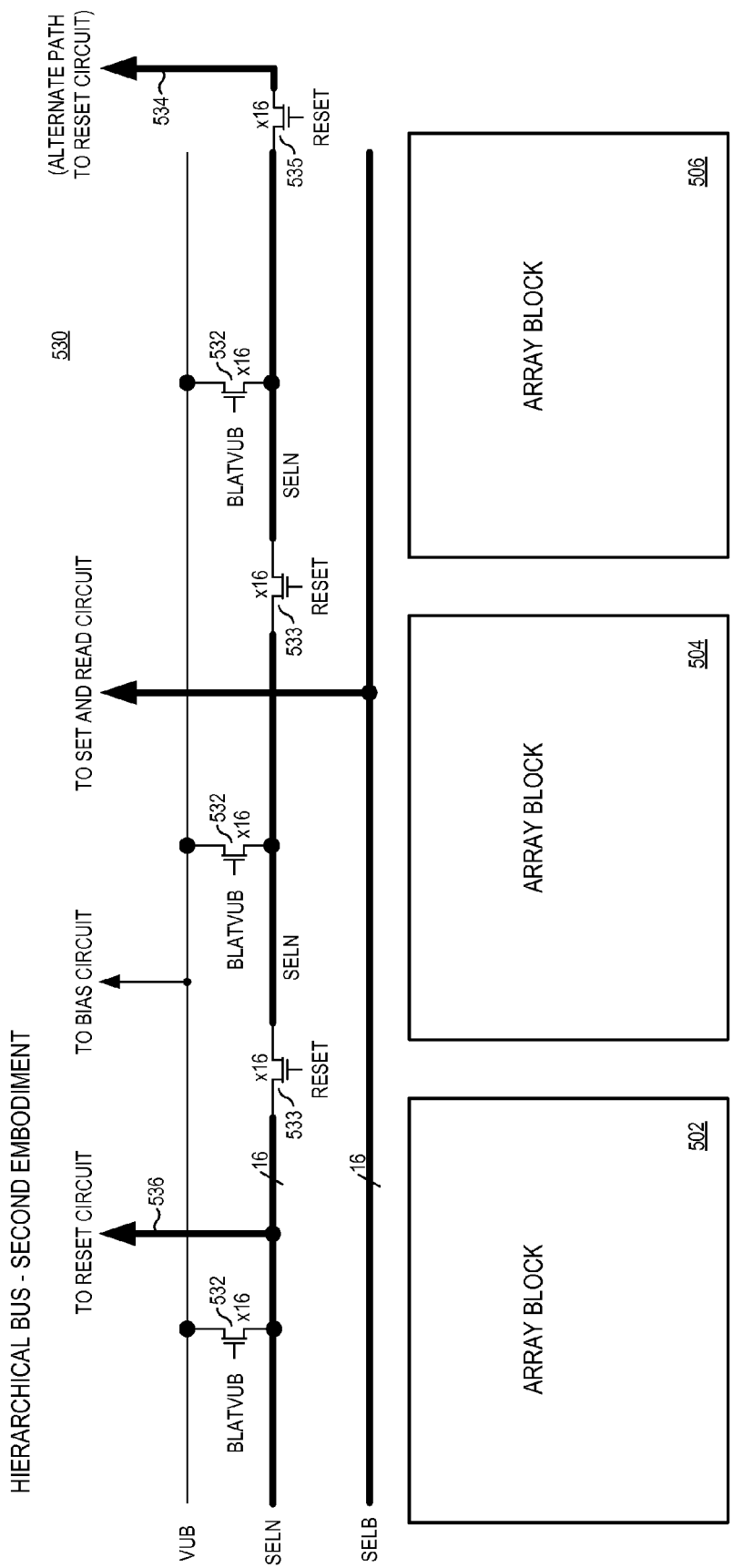
FIG. 20 is a block diagram of a portion of a memory bay, illustrating another exemplary hierarchical decoding arrangement for providing appropriate conditions on the source selection busses for the selected and unselected array blocks.

Referring now to FIG. 20, another embodiment is depicted in which the respective SELN bus segments are coupled together to form a single larger bus which spans the entire memory bay. In the set mode, the SELN bus segment for a selected array block is coupled to a single bias line VUB which spans the entire memory bay by a coupling circuit 532. This coupling circuit 532 may be as simple as 16 transistors, each coupling a respective SELN bus line to the VUB bias line (which is coupled to an appropriate bias circuit, as indicated). This coupling circuit 532 is enabled by a control signal BLATVUB, which is active for the selected array block when in the set mode. For the unselected array blocks, the respective BLATVUB control signal is inactive, the respective coupling circuit 532 turned off, and thus the respective SELN bus segment left floating, as desired.

In the reset mode, the SELB bus is driven to the VUX voltage (e.g., ground) to provide the unselected bit line bias condition for reset programming. In addition, the respective SELN bus segments are coupled together by a coupling circuit 533 to form a single bus which spans the entire memory bay, which is coupled to the reset circuit to provide to the combined busses the reset data information. One of the SELN bus segments may be coupled to the reset circuit by bus 536. In certain embodiments, a coupling circuit 535 may be utilized to provide the connection to the reset block in the RESET mode.

This is a relatively simple circuit arrangement that only requires one additional bias line (VUB) and 32 extra transistors per array block (the coupling circuits 532, 533). Like the previous embodiment, there is still a relatively high capacitance on both the SELB and SELN busses.

Figure 21:
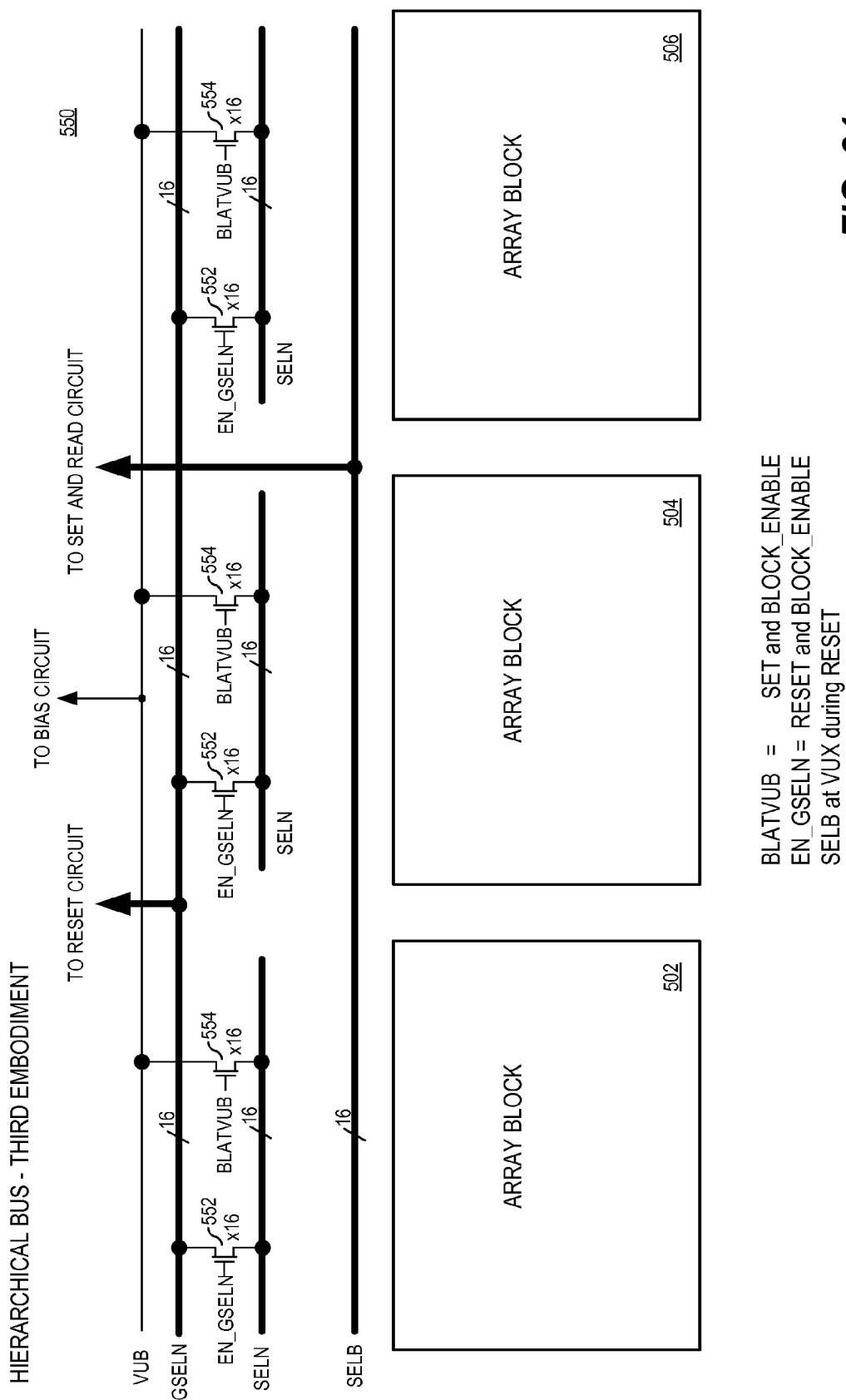
FIG. 21 is a block diagram of a portion of a memory bay, illustrating another exemplary hierarchical decoding arrangement for providing appropriate conditions on the source selection busses for the selected and unselected array blocks.

Referring now to FIG. 21, a bus arrangement 550 is depicted which incorporates features from both previous embodiments. In the SET mode, the SELN bus segment for a selected array block is coupled to a VUB bias line which spans the entire memory bay by a coupling circuit 554, which is enabled by a control signal BLATVUB. The respective BLATVUB control signal for the unselected array blocks is inactive, the respective coupling circuit 554 turned off, and thus the respective SELN bus segment left floating, as desired (since the EN_GSELN signal is also inactive in the SET mode).

In the reset mode, the respective EN_GSELN control signal for a selected array block is active, and a respective coupling circuit 552 is turned on to couple the respective SELN bus segment to the GSELN bus. The respective EN_GSELN control signal for the unselected array blocks is inactive, the respective coupling circuit 552 turned off, and the respective SELN bus segment left floating. This configuration provides the write data to only the selected array block(s), which reduces the total capacitance significantly. The SELB bus is driven to the VUX voltage (e.g., ground) to provide the unselected bit line bias condition for reset programming.

This circuit arrangement requires 17 additional lines (VUB bus and GSELN bus) and 32 extra transistors per array block (the coupling circuits 552, 554). Unlike the previous embodiments, this arrangement provides for significantly reduced capacitance on the SELN bus, since the respective SELN bus segments for unselected array blocks are not coupled to the GSELN bus. There remains fairly high capacitance on the SELB bus.

Figure 22:
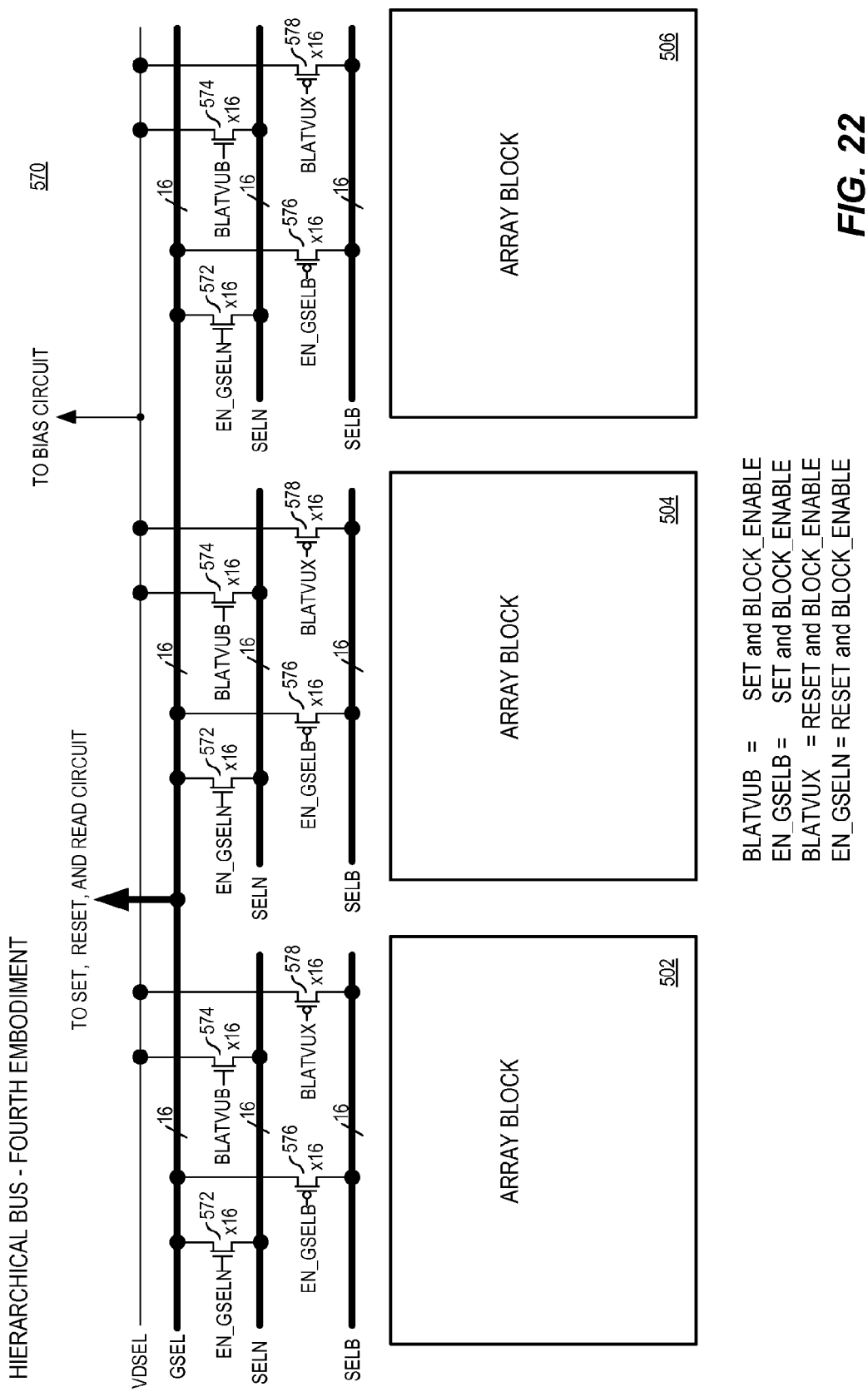
FIG. 22 is a block diagram of a portion of a memory bay, illustrating another exemplary hierarchical decoding arrangement for providing appropriate conditions on the source selection busses for the selected and unselected array blocks.

FIG. 22 depicts yet another hierarchical bus arrangement, this time utilizing only a single global select bus GSEL spanning the memory bay, and divides the SELB bus into a respective SELB bus segment for each array block. For a selected array block, either the respective SELB bus or the respective SELN bus segment is coupled to this GSEL bus. During SET mode, the selected block SELB bus segment is coupled to the GSEL bus, and the selected block SELN bus segment is coupled to the VDSEL bias line (which during SET conveys the unselected bit line bias condition, VUB, generated by an appropriate bias circuit, as indicated). The unselected block SELN busses are left floating.

During RESET mode, the selected block SELN bus segment is coupled to the GSEL bus, and the selected block SELB bus segment is coupled to the VDSEL bias line (which during RESET conveys the unselected word line bias condition, VUX). The unselected block SELN busses are again left floating.

This arrangement is the most complex of those described, requiring 17 global lines (i.e., spanning the memory bay) and 64 extra transistors per array block, and may require more layout area in some embodiments. However, it also provides low capacitance on the SELB and SELN busses, and thus would allow higher performance, and provides a very modular block design. Moreover, larger memory bays may be implemented without significantly increasing the capacitance on the SELB and SELN busses.

In another embodiment, the column decoder circuits could be modified to provide a separate column decode outputs for the NMOS and PMOS transistors of the bit line driver circuit so the bit line selector can be put in high impedance state. But this arrangement would significantly increase the area of the bit line selector, as well as the column decoder itself.

Figure 23:
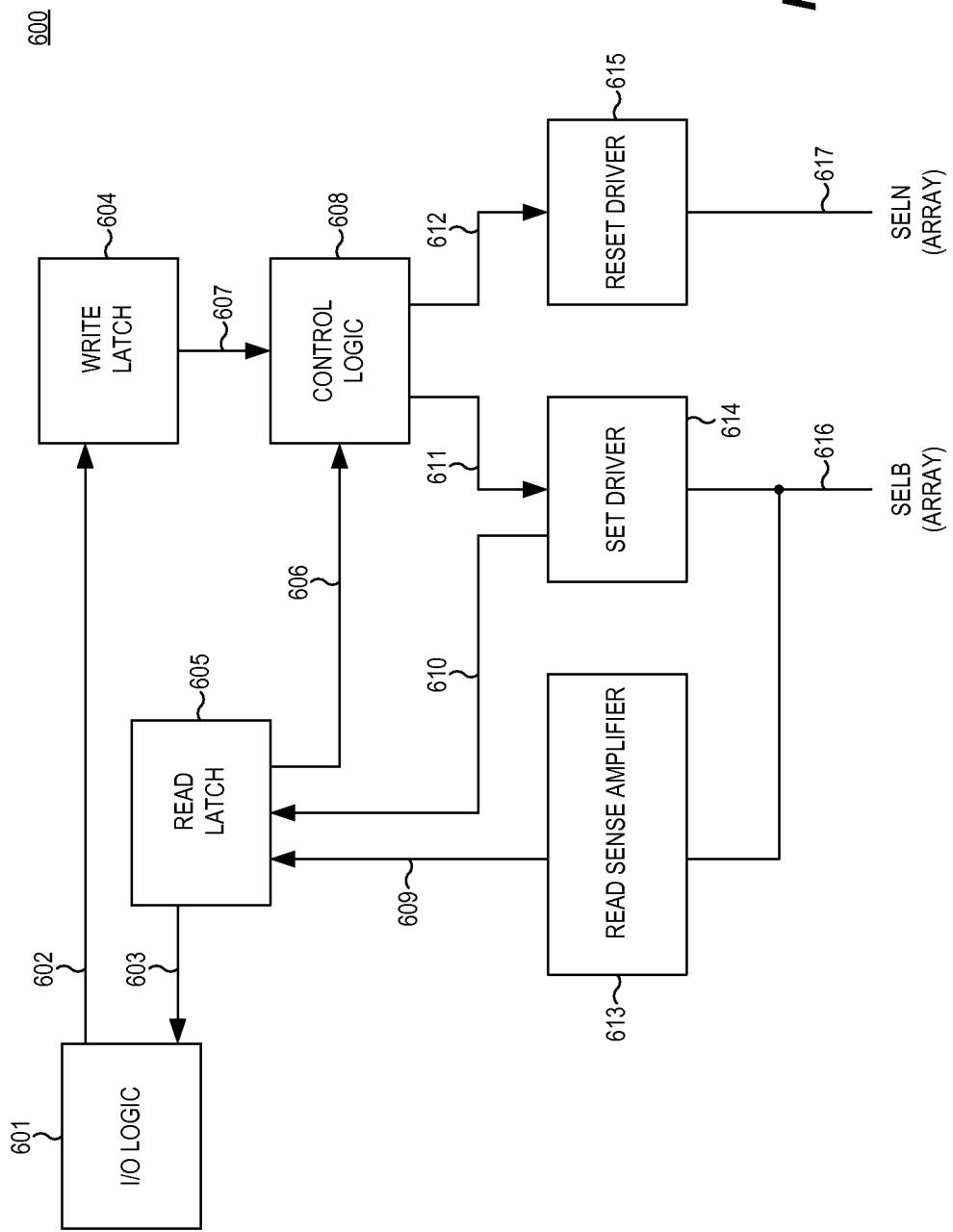
FIG. 23 is a block diagram of a data circuit, including a read sense amplifier, a set driver, and a reset driver useful for various embodiments described herein.

Referring now to FIG. 23, a data circuit is depicted which includes separate blocks for the set, reset, and read modes. Recall that, in the reverse bias mode (i.e., reset mode), the selected bit lines are coupled to a respective SELN bus line (i.e., the reverse source selection bus). Here we find a reset driver 615 coupled to the SELN bus 617 (which represents the path to the SELN bus for any of the four hierarchical bus arrangements which may be employed). In essence, this represents the path which ultimately is coupled to the SELN bus segment for a selected array block. Data information to be written is received into I/O logic 601, conveyed on bus 602 to a write latch block 604, conveyed on bus 607 to control logic 608, which then controls the reset driver 615 by way of control lines 612.

Recall that, in the forward mode, the selected bit lines are coupled to a respective SELB bus line. Since both the SET and READ modes utilize the forward bias mode, both a set driver 614 and a read sense amplifier 613 are coupled to the SELB bus 616 (which represents the path to the SELB bus for any of the four hierarchical bus arrangements above, or any other arrangement which may be employed). Sensed data is conveyed by bus 609 to a read latch 605, with is conveyed by bus 603 to the I/O logic 601. The various busses 606, 610, and 611 provide for a programming control loop, sometimes called smart write, which can shut off the programming current when a bit is successfully popped or set. The busses also provide for a read before write capability to determine, for example, any previously-programmed state (e.g., LSB data bit) that should be preserved during a subsequent programming operation. Such a capability is described further in the 023-0049 and 023-0055 applications, referenced below.

Figure 24:
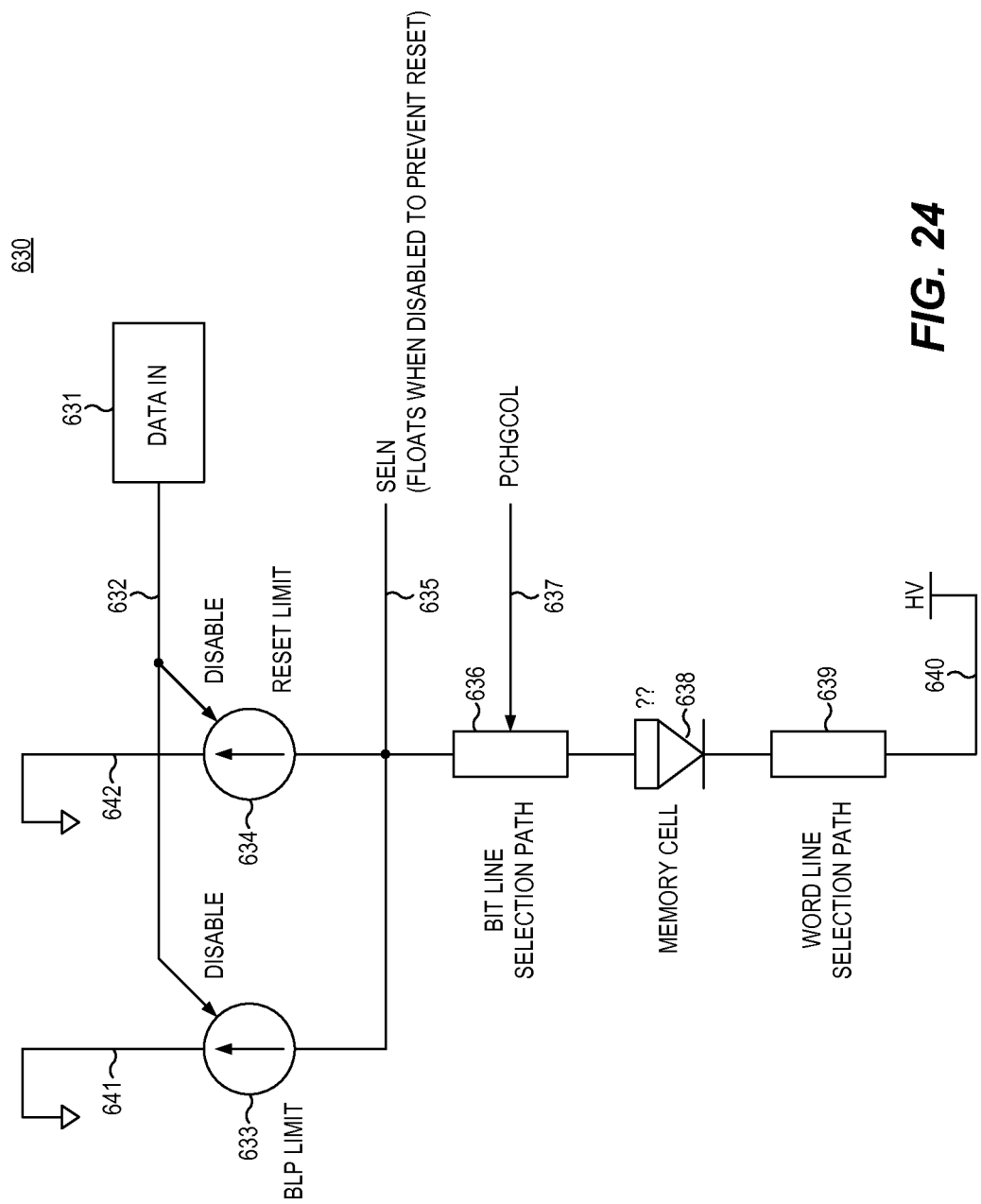
FIG. 24 is a block diagram of an exemplary reset circuit, including a depiction of the reset path through a selected memory cell and the word line and bit line selection paths.

A simplified exemplary reset driver 615 is depicted in FIG. 24, along with a representation of the word line and bit line selection paths to a selected memory cell 638. A word line selection path 639 represents the path through the word line driver circuit (i.e., the decoder head) and to the circuit for generating the decoded source selection bus XSELN. A bit line selection path 636 represents the path through the bit line driver circuit and through any bus coupling circuits, such as those described in the various hierarchical bus arrangement embodiments, to the individual SELN bus line 635. A preferred reset method and associated reset driver is described in the SAND-01114US0 and SAND-01114US1 applications referenced below, particularly in regards to FIG. 13 therein.

The capacitance of the bit line selection path is precharged before attempting to program a newly addressed selected bit line. This may be performed using a higher magnitude of current than is desirable to actually reset the selected memory cell, but if timed properly, such a higher magnitude precharge can speed up the precharge time without detrimental effect to the memory cell. This precharge is controlled by a precharge column signal PCHGCOL conveyed on control signal 637 to the bit line selection path 636. A bit line precharge (BLP) current limit circuit 633 and a reset limit circuit 634 are both provided to control the upper magnitude of the respective bit line precharge and reset currents. Both are disabled by signal 632 if the data is such that no reset operation is necessary, and the SELN bus line 635 floats.

Conversely, if the data is such that the memory cell is to be reset, the disable line 632 is inactive, and the BLP current limit circuit 633 is enabled briefly (e.g., 200-500 ns) to provide a higher level of controlled current for such precharge, after which it is disabled (by a control signal not shown), leaving the reset current limit circuit 634 to supply a lower magnitude of current for resetting the selected memory cell. Since resetting a memory cell causes it to change from a lower to a higher resistance state, there is little need to sense completion of the reset operation and disable the reset limit 634, since the cell turns off by itself as soon as it reaches the reset state.

As regards various embodiments described above, many types of memory cells are capable of being programmed using a reverse bias (e.g., the reset mode described above). Such cells include a passive element cell having a metal oxide (e.g., a transition metal oxide) and a diode. Other suitable cells include those having a resistive material in a diode matrix. Examples include a programmable metallization connection, a phase change resistor such as GST material, an organic material variable resistor, a complex metal oxide, a carbon polymer film, a doped chalcogenide glass, and a Schottky barrier diode containing mobile atoms to change resistance. The resistive material chosen may provide one-time-programmable (OTP) memory cells, or write-many memory cells. In addition, a polysilicon diode could be employed having conduction modified by reverse bias stress.

Useful memory cells for reverse reset operation are described in U.S. Pat. No. 6,952,030 entitled "High-Density Three-Dimensional Memory Cell" to S. Brad Herner, et al.;

and also in U.S. application Ser. No. 11/237,167 entitled "Method for Using a Memory Cell Comprising Switchable Semiconductor Memory Element with Trimmable Resistance" by Tanmay Kumar, et al., filed on Sep. 28, 2005, published as U.S. Publication No. 2007-0090425. A suitable metal oxide memory cell is shown in U.S. application Ser. No. 11/394,903 filed on Mar. 31, 2006, entitled "Multilevel Nonvolatile Memory Cell Comprising a Resistivity-Switching Oxide or Nitride and an Antifuse" by S. Brad Herner, published as U.S. Publication No. 2007-0236981. A suitable memory cell using a phase change material, which can provide multiple resistance states, is shown in U.S. Patent Application Publication No. 2005-0158950 entitled "Non-Volatile Memory Cell Comprising a Dielectric Layer and a Phase Change Material in Series" by Roy E. Scheuerlein, et al. Each of these above-referenced disclosures is incorporated herein by reference in its entirety. Other exemplary memory cells having a transition-metal oxide (e.g., including those having cobalt), and exemplary cells in which the polysilicon material of the steering element itself comprises the switchable resistance material, are described in the MA-163-1 application referenced below.

In addition, U.S. application Ser. No. 11/125,939 filed on May 9, 2005, entitled "Rewritable Memory Cell Comprising a Diode and a Resistance Switching Material" by S. Brad Herner, et al., published as U.S. Publication No. 2006-0250836, discloses a useful rewritable memory cell incorporating a diode in series with an oxide, such as a nickel oxide, in which the resistance of the memory cell may be repeatedly switched from low to high and from high to low resistance states. U.S. application Ser. No. 11/395,995 filed on Mar. 31, 2006, entitled "Nonvolatile Memory Cell Comprising a Diode and a Resistance Switching Material" by S. Brad Herner, et al., published as U.S. Publication No. 2006-0250837, discloses a OTP multi-level memory cell which is set using forward bias and reset using reverse bias. Each of these above-referenced disclosures is incorporated herein by reference in its entirety.

In many of the embodiments described herein, the precise bias conditions imposed upon each respective bus line in the data path is independently controllable. The specific voltage and current settings for each of the set and reset drivers can be adjusted for each bit of the data path. As a result, certain memory cells having more than two states (i.e., "multi-level" memory cells) are contemplated for use with many of the structures described herein. Exemplary multi-level memory cells are described in the aforementioned U.S. application Ser. No. 11/237,167, and in the MA-163-1 application, referenced below.

Exemplary passive element memory cells and related non-volatile memory structures which may be useful in practicing the present invention are described the following documents, each of which is incorporated herein by reference in its entirety:

U.S. Pat. No. 6,034,882 entitled "Vertically Stacked Field Programmable Nonvolatile Memory and Method of Fabrication" to Mark G. Johnson, et al.;

U.S. Pat. No. 6,420,215 entitled "Three Dimensional Memory Array and Method of Fabrication" to N. Johan Knall, et al.;

U.S. Pat. No. 6,525,953 entitled "Vertically-Stacked, Field Programmable, Nonvolatile Memory and Method of Fabrication" to Mark Johnson, et al.;

U.S. Pat. No. 6,490,218 entitled "Digital Memory Method and System for Storing Multiple-Bit Digital Data" to Michael Vyvoda, et al.;

U.S. Pat. No. 6,952,043 entitled "Electrically Isolated Pillars in Active Devices" to Michael Vyvoda, et al.; and U.S. Patent Application Publication No. US2005-0052915 entitled "Nonvolatile Memory Cell Without a Dielectric Antifuse Having High- and Low-Impedance States" by S. Brad Herner, et al.

Memory cell structures, circuits, systems, and methods that may be useful in practicing the present invention, are described in the following applications, each filed on Jul. 31, 2006, each of which is incorporated herein by reference in its entirety:

U.S. application Ser. No. 11/496,985, now U.S. Publication No. 2007-0069276, entitled "Multi-Use Memory Cell and Memory Array" by Roy Scheuerlein and Tanmay Kumar (the "10519-141" application);

U.S. application Ser. No. 11/496,984, now U.S. Publication No. 2007-0070690, entitled "Method for Using a Multi-Use Memory Cell and Memory Array" by Roy Scheuerlein and Tanmay Kumar (the "10519-150" application);

U.S. application Ser. No. 11/496,874, now U.S. Publication No. 2008-0023790, entitled "Mixed-Use Memory Array" by Roy Scheuerlein (the "10519-142" application);

U.S. application Ser. No. 11/496,983, now U.S. Publication No. 2008-0025118, entitled "Method for Using a Mixed-Use Memory Array" by Roy Scheuerlein (the "10519-151" application);

U.S. application Ser. No. 11/496,870, now U.S. Publication No. 2008-0025069, entitled "Mixed-Use Memory Array With Different Data States" by Roy Scheuerlein and Christopher Petti (the "10519-149" application);

U.S. application Ser. No. 11/497,021, now U.S. Publication No. 2008-0025062, entitled "Method for Using a Mixed-Use Memory Array With Different Data States" by Roy Scheuerlein and Christopher Petti (the "10519-152" application);

U.S. application Ser. No. 11/461,393, now U.S. Publication No. 2008-0025076, entitled "Controlled Pulse Operations in Non-Volatile Memory" by Roy Scheuerlein (the "SAND-01114US0" application);

U.S. application Ser. No. 11/461,399, now U.S. Publication No. 2008-0025077, entitled "Systems for Controlled Pulse Operations in Non-Volatile Memory" by Roy Scheuerlein (the "SAND-01114US1" application);

U.S. application Ser. No. 11/461,410, now U.S. Publication No. 2008-0025061, entitled "High Bandwidth One-Time Field-Programmable Memory" by Roy Scheuerlein and Christopher J. Petti (the "SAND-01115US0" application);

U.S. application Ser. No. 11/461,419, now U.S. Publication No. 2008-0025067, entitled "Systems for High Bandwidth One-Time Field-Programmable Memory" by Roy Scheuerlein and Christopher J. Petti (the "SAND-01115US1" application);

U.S. application Ser. No. 11/461,424, now U.S. Publication No. 2008-0025068, entitled "Reverse Bias Trim Operations in Non-Volatile Memory" by Roy Scheuerlein and Tanmay Kumar (the "SAND-01117US0" application);

U.S. application Ser. No. 11/461,431, now U.S. Publication No. 2008-0025078, entitled "Systems for Reverse Bias Trim Operations in Non-Volatile Memory" by Roy Scheuerlein and Tanmay Kumar (the "SAND-01117US1" application);

U.S. application Ser. No. 11/496,986, now U.S. Publication No. 2007-0072360, entitled "Method for Using a Memory Cell Comprising Switchable Semiconductor Memory Element with Trimmable Resistance" by Tanmay Kumar, S. Brad Herner, Roy E. Scheuerlein, and Christopher J. Petti (the "MA-163-1" application);

U.S. application Ser. No. 11/461,339, now U.S. Publication No. 2008-0025066, entitled "Passive Element Memory Array Incorporating Reversible Polarity Word Line and Bit Line Decoders" by Luca G. Fasoli, Christopher J. Petti, and Roy E. Scheuerlein (the "023-0048" application);

U.S. application Ser. No. 11/461,364, now U.S. Publication No. 2008-0025132, entitled "Method for Using a Passive Element Memory Array Incorporating Reversible Polarity Word Line and Bit Line Decoders" by Luca G. Fasoli, Christopher J. Petti, and Roy E. Scheuerlein (the "023-0054" application);

U.S. application Ser. No. 11/461,343, now U.S. Publication No. 2008-0025088, entitled "Apparatus for Reading a Multi-Level Passive Element Memory Cell Array" by Roy E. Scheuerlein, Tyler Thorp, and Luca G. Fasoli (the "023-0049" application);

U.S. application Ser. No. 11/461,367, now U.S. Publication No. 2008-0025089, entitled "Method for Reading a Multi-Level Passive Element Memory Cell Array" by Roy E. Scheuerlein, Tyler Thorp, and Luca G. Fasoli (the "023-0055" application);

U.S. application Ser. No. 11/461,352, now U.S. Publication No. 2008-0025131, entitled "Dual Data-Dependent Busses for Coupling Read/Write Circuits to a Memory Array" by Roy E. Scheuerlein and Luca G. Fasoli (the "023-0051" application);

U.S. application Ser. No. 11/461,369, now U.S. Publication No. 2008-0025133, entitled "Method for Using Dual Data-Dependent Busses for Coupling Read/Write Circuits to a Memory Array" by Roy E. Scheuerlein and Luca G. Fasoli (the "023-0056" application);

U.S. application Ser. No. 11/461,359, now U.S. Publication No. 2008-0025085, entitled "Memory Array Incorporating Two Data Busses for Memory Array Block Selection" by Roy E. Scheuerlein, Luca G. Fasoli, and Christopher J. Petti (the "023-0052" application);

U.S. application Ser. No. 11/461,372, now U.S. Publication No. 2008-0025134, entitled "Method for Using Two Data Busses for Memory Array Block Selection" by Roy E. Scheuerlein, Luca G. Fasoli, and Christopher J. Petti (the "023-0057" application);

U.S. application Ser. No. 11/461,362, now U.S. Publication No. 2008-0025093, entitled "Hierarchical Bit Line Bias Bus for Block Selectable Memory Array" by Roy E. Scheuerlein and Luca G. Fasoli (the "023-0053" application); and U.S. application Ser. No. 11/461,376, now U.S. Publication No. 2008-0025094, entitled "Method for Using a Hierarchical Bit Line Bias Bus for Block Selectable Memory Array" by Roy E. Scheuerlein and Luca G. Fasoli (the "023-0058" application).

As should be appreciated, specific exemplary embodiments shown herein have been described in the context of specific numeric examples, such as the number of decoded outputs, the number of decoder heads, the number of bus lines, the number of data busses, the number of array blocks within a memory bay, and the number of memory stripes. Other variations consistent with other design objectives may be implemented using the teachings of this disclosure. In the interest of clarity, not all of the routine features of the implementations described herein are shown and described.

Most memory arrays are designed having a relatively high degree of uniformity. For example, usually every bit line includes the same number of memory cells. As another example, the number of bit lines, word lines, array blocks, and even memory planes is frequently an integral power of two in number (i.e., $2^N$), for ease and efficiency of decode circuitry. But such regularity or consistency is certainly not required for any of the embodiments of the present invention. For example, word line segments on different layers may include different numbers of memory cells, the memory array may include three memory planes, word line segments within the first and last array block may be different in number of memory cells or bit line configuration, and any of many other irregular variations to the usual consistency of memory array design. Unless otherwise explicitly recited in the claims, such usual regularity, even as shown in the embodiments described herein, should not be imported into the meaning of any claim.

It should be appreciated that the designations top, left, bottom, and right are merely convenient descriptive terms for the four sides of a memory array. The word line segments for a block may be implemented as two inter-digitated groups of word line segments oriented horizontally, and the bit lines for a block may be implemented as two inter-digitated groups of bit lines oriented vertically. Each respective group of word lines or bit lines may be served by a respective decoder/driver circuit and a respective sense circuit on one of the four sides of the array.

As used herein, a row extends across the entire memory bay (if not across the entire stripe) and includes many word lines. As used herein a bus or line which is "generally spanning the plurality of array blocks" includes spanning almost all the array blocks, such as spanning all but the last block (e.g., a last block to which a given bus is not coupled to). Such a bus or line may be disposed to the side of the array blocks, or may be disposed above or below such memory array block (i.e., in a direction normal to a semiconductor substrate).

As used herein, "coupling selected bit lines to a first bus" means respectively coupling each such selected bit line to a corresponding bus line of the first bus. As used herein, word lines (e.g., including word line segments) and bit lines usually represent orthogonal array lines, and generally follow a common assumption in the art that word lines are driven and bit lines are sensed, at least during a read operation. Moreover, as used herein, a "global line" (e.g., a global select line) is an array line that spans more than one memory block, but no particular inference should be drawn suggesting such a global line must traverse across an entire memory array or substantially across an entire integrated circuit.

As used herein, a read/write circuit (e.g., a set and read circuit) may be for one or more data bits, and therefore may be coupled to a single wire, or may include a separate such read/write circuit coupled to each bus line of a data bus for each separate bit of data.

As used herein, a "data bus" or data bus "segment" conveys data-dependent information at least at times, but need not do so at all times. For example, such a data bus may convey identical bias information on each bus line of such a data bus for certain modes of operation. As used herein, a "global" bus may traverse across multiple array blocks, but need not traverse across (or "span") the entire memory array. For example, such a global bus may traverse across a memory bay, but not necessarily across an entire memory stripe. A "data circuit" may include one or more, or any combination, of a read/write circuit, a set circuit, a reset circuit, a read circuit, or a program circuit, as appropriate.

As used herein, "selected" lines, such as selected bit lines within an array block, correspond to such bit lines that are simultaneously selected by a multi-headed decoder circuit, and each coupled to a corresponding bus line. Such bit lines may or may not also be selected by data or I/O circuits to actually perform a given read, program, set, reset, or erase operation. For example, if a 16-headed column decoder simultaneously "selects" and couples 16 bit lines to a given bus (e.g., SELN bus), it is contemplated that none of the bit lines, one bit line, more than one bit line, or all the bit lines of this group of 16 bit lines, may actually receive a selected bias condition suitable for the given mode of operation, while the remaining bit lines may receive an unselected bias condition. Such a bus may be described as being a "data-dependent" bus. In other embodiments, there may be more than one such "selected" bias condition conveyed on a given bus, such as when two simultaneously selected memory cells are to be programmed to different data states.

As used herein, a passive element memory array includes a plurality of 2-terminal memory cells, each connected between an associated X-line (e.g., word line) and an associated Y-line (e.g., bit line). Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. A passive element memory array may be a one-time programmable (i.e., write once) memory array or a read/write (i.e., write many) memory array. Such passive element memory cells may generally be viewed as having a current steering element directing current in a direction and another component which is capable of changing its state (e.g., a fuse, an antifuse, a capacitor, a resistive element, etc.). The programming state of the memory element can be read by sensing current flow or voltage drop when the memory element is selected.

The directionality of various array lines in the various figures is merely convenient for ease of description of the two groups of crossing lines in the array. As used herein, an integrated circuit memory array is a monolithic integrated circuit structure, rather than more than one integrated circuit device packaged together or in close proximity.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, packaged modules including such circuits, systems utilizing such circuits and/or modules and/or other memory devices, related methods of operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium. An encoding of a circuit may include circuit schematic information, physical layout information, behavioral simulation information, and/or may include any other encoding from which the circuit may be represented or communicated.

The foregoing detailed description has described only a few of the many possible implementations of the present invention. For this reason, this detailed description is intended by way of illustration, and not by way of limitations. Moreover, the embodiments described above are specifically contemplated to be used alone as well as in various combinations. Variations and modifications of the embodiments disclosed herein may be made based on the description set forth herein. It is only the following claims, including all equivalents, that are intended to define the scope of this invention. Accordingly, other embodiments, variations, and improvements not described herein are not necessarily excluded from the scope of the invention.

What is claimed is:

1. In an integrated circuit having a memory array comprising a plurality of linearly-arranged array blocks, a method comprising:
   simultaneously selecting in a first mode of operation a greater number of array blocks than in a second mode of operation.

2. The method of claim 1 wherein:
   the first mode of operation is a write mode;
   the second mode of operation is a read mode; and
   in both the first and second modes of operations, simultaneously selecting less than all bit lines in each selected array block.

3. The method of claim 2 wherein:
   in the write mode, simultaneously selecting two array blocks and writing M bits into each of said selected two array blocks; and
   in the read mode, selecting one array block and reading 2*M bits from the selected array block.

4. The method of claim 3 wherein M=32.

5. The method of claim 3 wherein:
   said writing M bits into each of said selected two array blocks comprises simultaneously writing M bits into each of said selected two array blocks.

6. The method of claim 3 wherein:
   said selected two array blocks in the write mode comprise adjacent array blocks.

7. The method of claim 6 further comprising:
   in the write mode, selecting a single word line that is shared by both of said selected two adjacent array blocks.

8. The method of claim 3 wherein:
   said writing M bits into each of said selected two array blocks includes coupling each of a first plurality M of bit lines within a first selected array block to a respective bus line of a first M-bit data bus, and coupling each of a second plurality M of bit lines within a second selected array block to a respective bus line of a second M-bit data bus; and
   said reading 2*M bits from the selected array block includes coupling each of a third plurality M of bit lines within a third selected array block to a respective bus line of the first M-bit data bus, and coupling each of a fourth plurality M of bit lines within the third selected array block to a respective bus line of the second M-bit data bus.

9. The method of claim 8 wherein:
said writing M bits into each of said selected two array blocks further comprises selecting a single word line that is shared by the first selected array block and the second selected array block; and
the first selected array block and the second selected array block are adjacent array blocks.

10. The method of claim 8 wherein:
the first M-bit data bus spans the plurality of linearly-arranged array blocks; and
the second M-bit data bus spans the plurality of linearly-arranged array blocks.

11. The method of claim 10 wherein M=32.

* * * * *